(12) United States Patent
Shin et al.

(10) Patent No.: US 11,462,711 B2
(45) Date of Patent: Oct. 4, 2022

(54) LIGHT-EMITTING DEVICE AND METHOD OF FABRICATING DISPLAY PANEL THEREWITH

(71) Applicant: Samsung Display Co., Ltd., Yongin-si (KR)

(72) Inventors: Hyuneok Shin, Gwacheon-si (KR); Chanwoo Yang, Siheung-si (KR); Juhyun Lee, Seongnam-si (KR); Sanggab Kim, Seoul (KR); Joonyong Park, Gunpo-si (KR); Seungwook Chang, Suwon-si (KR); Jinwook Jeong, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/202,229

(22) Filed: Mar. 15, 2021

(65) Prior Publication Data

US 2021/0226153 A1    Jul. 22, 2021

Related U.S. Application Data

(63) Continuation-in-part of application No. 15/834,524, filed on Dec. 7, 2017, now abandoned.

(30) Foreign Application Priority Data

Jun. 26, 2017    (KR) .................. 10-2017-0080715

(51) Int. Cl.
*H01L 51/52* (2006.01)
*H01L 51/56* (2006.01)
(Continued)

(52) U.S. Cl.
CPC ...... *H01L 51/5218* (2013.01); *H01L 51/5088* (2013.01); *H01L 51/56* (2013.01);
(Continued)

(58) Field of Classification Search
CPC ............ H01L 51/5218; H01L 51/5088; H01L 51/5092; H01L 51/5206; H01L 51/5056;
(Continued)

(56) References Cited

U.S. PATENT DOCUMENTS 7,868,538 B2    1/2011    Lee et al.
9,099,681 B2    8/2015    Kijima
(Continued)

FOREIGN PATENT DOCUMENTS

CN    101097948 A    1/2008
CN    101785129 A    7/2010
(Continued)

OTHER PUBLICATIONS

Extended European Search Report dated Oct. 26, 2018 for EP 18168068.7, 10 pages.

*Primary Examiner* — Yu Chen
(74) *Attorney, Agent, or Firm* — Lewis Roca Rothgerber Christie LLP

(57) ABSTRACT

A light-emitting device may include a first electrode, a second electrode, and a light-emitting layer therebetween. The first electrode may include a reflection layer and a metal oxide layer provided on the reflection layer. The metal oxide layer may be provided between the reflection layer and the light-emitting layer. The metal oxide layer may include molybdenum dioxide and an oxide of a group-V element, and a content of the group-V element to a total amount of the metal oxide layer may range from 2 at % to 10 at.

14 Claims, 22 Drawing Sheets

(51) Int. Cl.
*H01L 51/50* (2006.01)
*H01L 27/32* (2006.01)

(52) U.S. Cl.
CPC ...... *H01L 27/3206* (2013.01); *H01L 27/3216* (2013.01); *H01L 27/3246* (2013.01); *H01L 2251/303* (2013.01); *H01L 2251/5315* (2013.01)

(58) Field of Classification Search
CPC .. H01L 2251/303; H01L 33/40; H01L 33/405
See application file for complete search history.

(56) References Cited

U.S. PATENT DOCUMENTS

| | | | |
|---|---|---|---|
| 9,564,609 B2 | 2/2017 | Sasaki et al. | |
| 9,774,008 B2 | 9/2017 | Lee et al. | |
| 2003/0148871 A1 | 8/2003 | Inoue | |
| 2006/0279190 A1 | 12/2006 | Nakayama | |
| 2008/0012016 A1 | 1/2008 | Inoue et al. | |
| 2010/0102310 A1 | 4/2010 | Komatsu et al. | |
| 2010/0123152 A1 | 5/2010 | Sugisawa et al. | |
| 2011/0068327 A1 | 3/2011 | Morishima | |
| 2012/0187389 A1 | 7/2012 | Shoda et al. | |
| 2019/0334108 A1* | 10/2019 | Shin | H01L 51/5004 |
| 2020/0127221 A1* | 4/2020 | Lee | H01L 51/5218 |

FOREIGN PATENT DOCUMENTS

| | | | | |
|---|---|---|---|---|
| CN | 102637830 A | | 8/2012 | |
| CN | 102687302 A | | 9/2012 | |
| CN | 111864075 A | * | 10/2020 | |
| EP | 2 184 794 A1 | | 5/2010 | |
| JP | 2010-186637 A | | 8/2010 | |
| JP | 2012-238544 | | 12/2012 | |
| JP | 5115491 | | 1/2013 | |
| KR | 10-2016-0062287 A | | 6/2016 | |
| KR | 20210093403 A | * | 7/2021 | H01L 51/56 |
| WO | WO-2013059948 A1 | * | 5/2013 | H01L 51/0021 |

* cited by examiner

LIGHT-EMITTING DEVICE AND METHOD OF FABRICATING DISPLAY PANEL THEREWITH

CROSS-REFERENCE TO RELATED APPLICATION

This application is a continuation-in-part of U.S. application Ser. No. 15/834,524, filed on Dec. 7, 2017, which claims priority to and the benefit of Korean Patent Application No. 10-2017-0080715, filed in the Korean Intellectual Property Office on Jun. 26, 2017, the entire contents of all of which are incorporated herein by reference.

BACKGROUND

1. Field

The present disclosure relates to a light-emitting device, a display panel therewith, and a method of fabricating the display panel.

2. Description of the Related Art

A light-emitting device includes at least two electrodes and a light-emitting layer provided therebetween. Holes and electrons injected from the electrodes are recombined with each other in the light-emitting layer, thereby producing excitons. When the excitons make a transition from an excited state to a ground state, light is emitted from the light-emitting layer.

A display panel is provided to have a plurality of pixels, each of which includes a light-emitting device and a driving circuit for driving the light-emitting device.

SUMMARY

Aspects according to one or more embodiments of the present disclosure are directed toward a light-emitting device including an electrode suitable for a dry etching process, a high-resolution display panel including the same, and a method of fabricating the display panel.

An aspect according to one or more embodiments of the present disclosure is directed toward a light-emitting device suitable for a high resolution display panel.

An aspect according to one or more embodiments of the present disclosure is directed toward a method of fabricating a display panel with a low failure rate.

However, aspects of one or more embodiments of the present disclosure are not restricted to those set forth herein. The above and other aspects of one or more embodiments of the present disclosure will become more apparent to one of ordinary skill in the art to which the present disclosure pertains by referencing the detailed description of the present disclosure given below.

According to some embodiments of the inventive concept, a light-emitting device may include a first electrode including a reflection layer and a metal oxide layer on the reflection layer, a second electrode spaced apart from the first electrode, and a light-emitting layer between the first electrode and the second electrode. The metal oxide layer may be provided between the reflection layer and the light-emitting layer. The metal oxide layer may include molybdenum dioxide and an oxide of a group-V element, and a content of the group-V element to a total amount of the metal oxide layer may range from 2 at % to 10 at %.

In some embodiments, the oxide of the group-V element may be tantalum pentoxide, and a content of tantalum to the total amount of the metal oxide layer may range from 2 at % to 7 at %.

In some embodiments, a content of molybdenum to the total amount of the metal oxide layer may range from 35 at % to 45 at %, and a content of oxygen to the total amount of the metal oxide layer may range from 50 at % to 60 at %.

In some embodiments, the metal oxide layer may have a thickness ranging from about 30 Å to about 100 Å.

In some embodiments, the reflection layer may contain aluminum (Al).

In some embodiments, the reflection layer may contain an aluminum-nickel alloy.

In some embodiments, the reflection layer may contain an aluminum-nickel-lanthanum alloy.

In some embodiments, a content of nickel to a total amount of the reflection layer may range from 0.01 at % to 2.0 at %, and a content of lanthanum to the total amount of the reflection layer may range from 0.01 at % to 1.0 at %.

In some embodiments, the reflection layer may have a thickness ranging from about 700 Å to about 1500 Å.

In some embodiments, the metal oxide layer may be in direct contact with the reflection layer.

In some embodiments, the light-emitting device may further include an anti-oxidation layer between the reflection layer and the metal oxide layer. The anti-oxidation layer may include at least one element selected from nickel and titanium.

In some embodiments, the anti-oxidation layer may have a thickness ranging from about 10 Å to about 100 Å.

According to some embodiments of the inventive concept, a light-emitting device may include a first electrode including a reflection layer and a metal oxide layer thereon, a second electrode spaced apart from the first electrode, and a light-emitting layer between the first electrode and the second electrode. The metal oxide layer may be between the reflection layer and the light-emitting layer and may include a first metal oxide and a second metal oxide, the first metal oxide may contain molybdenum, the second metal oxide may contain at least one element selected from the group consisting of vanadium (V), niobium (Nb), tantalum (Ta), titanium (Ti), tungsten (W), germanium (Ge), tin (Sn), selenium (Se), and zirconium (Zr), and a content of vanadium (V), niobium (Nb), tantalum (Ta), titanium (Ti), tungsten (W), germanium (Ge), tin (Sn), selenium (Se), or zirconium (Zr) to a total amount of the metal oxide layer may range from 2 at % to 10 at %.

In some embodiments, a content of molybdenum to the total amount of the metal oxide layer may range from 35 at % to 45 at %, and a content of oxygen to the total amount of the metal oxide layer may range from 50 at % to 60 at %.

According to some embodiments of the inventive concept, a method of fabricating a display panel may include forming a reflection layer on a base layer to overlap with a plurality of light-emitting regions and a non-light-emitting region, forming a metal oxide layer on the reflection layer, the metal oxide layer including molybdenum dioxide and an oxide of a group-V element, a content of the group-V element to a total amount of the metal oxide layer ranging from 2 at % to 10 at %, and performing a dry etching process on the reflection layer and the metal oxide layer, thereby forming a plurality of first electrodes overlapping with the plurality of light-emitting regions, respectively.

In some embodiments, the forming of the metal oxide layer may be performed through a sputtering process utilizing a target, the target containing molybdenum dioxide and particles of the group-V element in molybdenum dioxide.

In some embodiments, the forming of the plurality of first electrodes may include etching both of the metal oxide layer and the reflection layer by a dry etching process utilizing at least one selected from the group consisting of fluorine gas and chlorine gas.

In some embodiments, the reflection layer may contain aluminum (Al). The method may further include forming a pixel definition layer to define a plurality of openings. The plurality of openings may overlap with the non-light-emitting region to expose the plurality of first electrodes.

In some embodiments, the method may further include forming a hole control layer to overlap with the plurality of light-emitting regions and the non-light-emitting region, forming a plurality of light-emitting layers to overlap with the plurality of light-emitting regions, respectively, forming an electron control layer to overlap with the plurality of light-emitting regions and the non-light-emitting region, and forming a second electrode to overlap with the plurality of light-emitting regions and the non-light-emitting region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
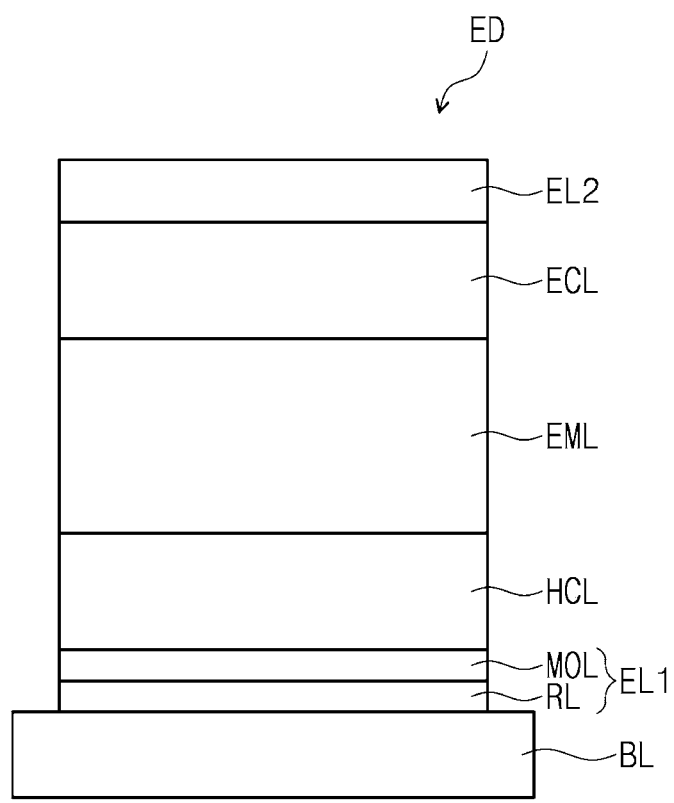
FIG. 1 is a sectional view illustrating a light-emitting device according to some embodiments of the inventive concept.

It should be noted that these figures are intended to illustrate the general characteristics of methods, structure and/or materials utilized in certain example embodiments and to supplement the written description provided below. However, these drawings are not to scale and may not reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
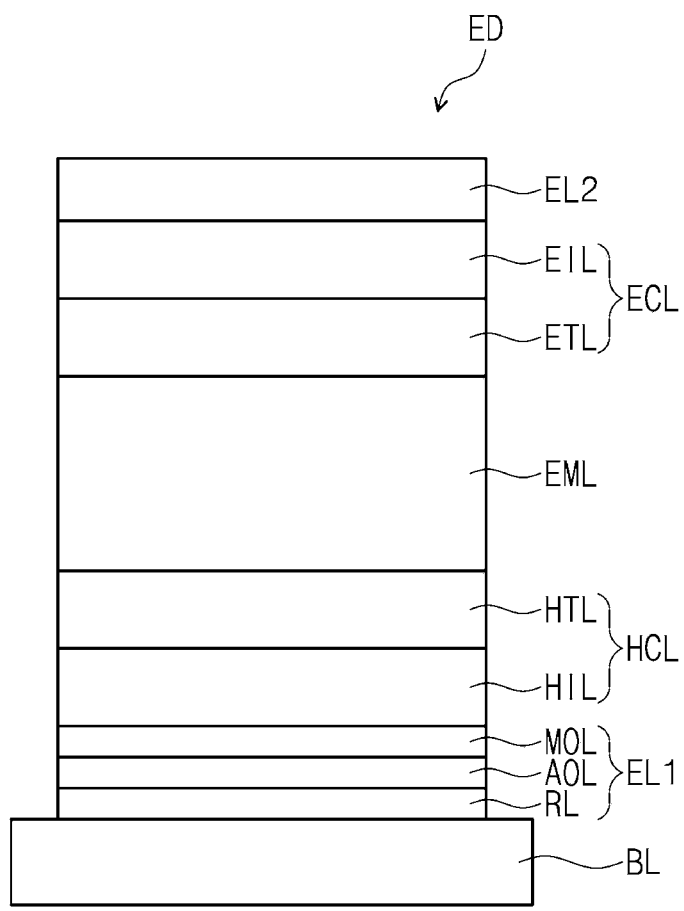
FIG. 2 is a sectional view illustrating a light-emitting device according to some embodiments of the inventive concept.
Figure 3A:
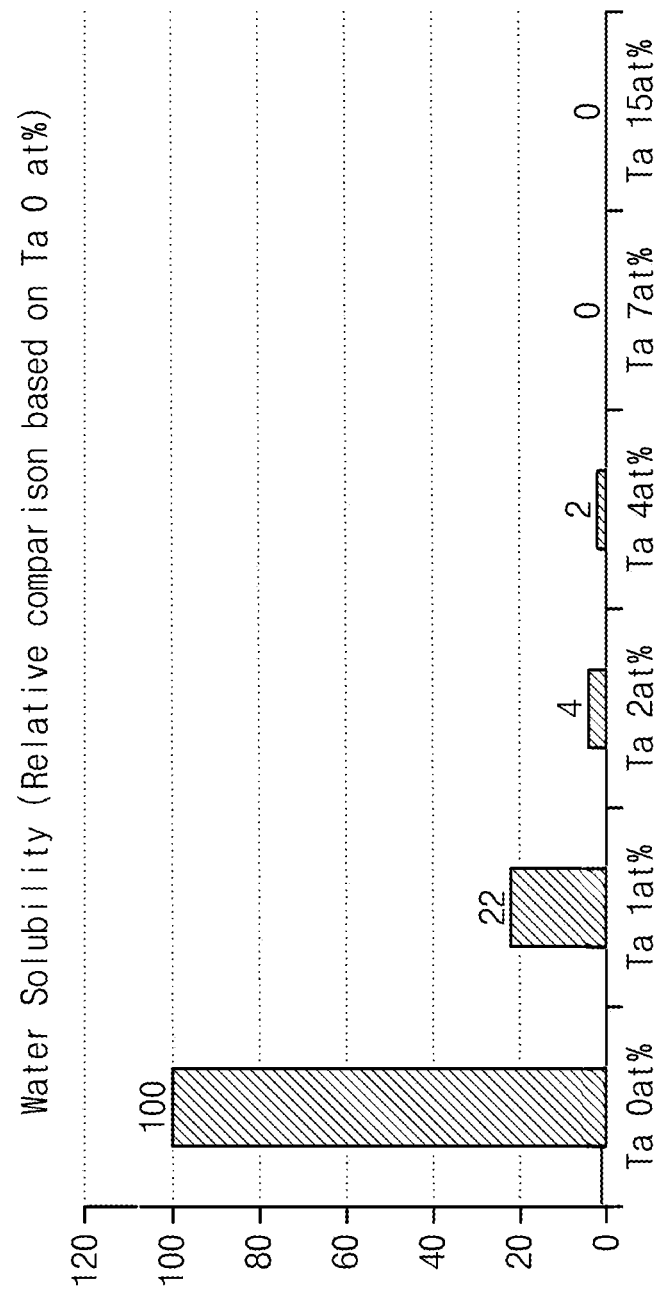
FIG. 3A is a graph showing water solubility of a metal oxide layer, according to the content of tantalum.
Figure 3B:
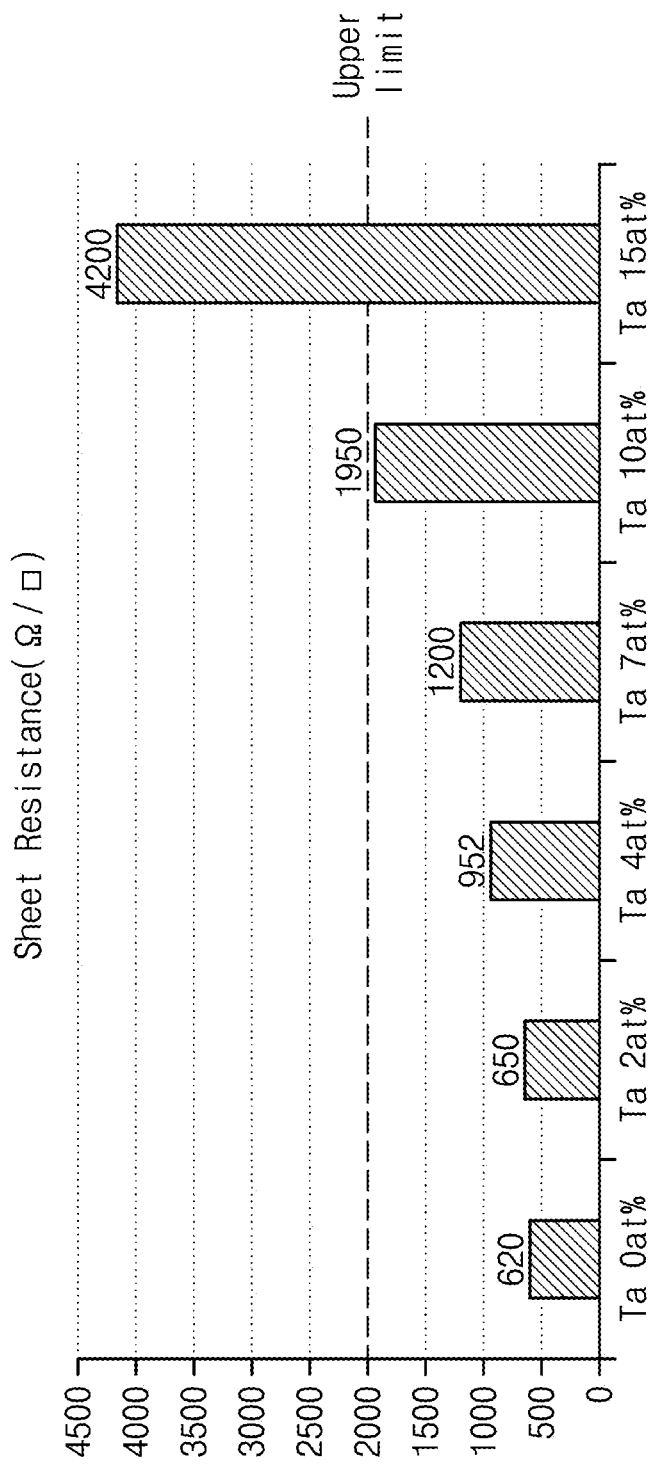
FIG. 3B is a graph showing sheet resistance of a metal oxide layer, according to the content of tantalum.
Figure 3C:
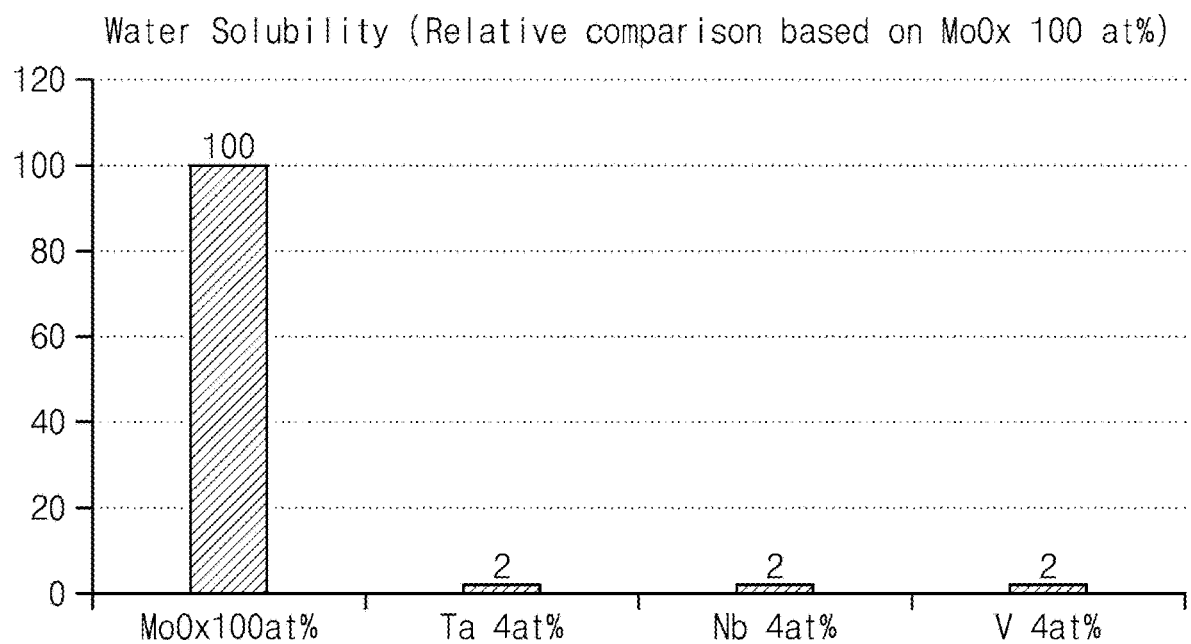
FIG. 3C is a graph showing water solubility of a metal oxide layer containing niobium or vanadium.
Figure 3D:
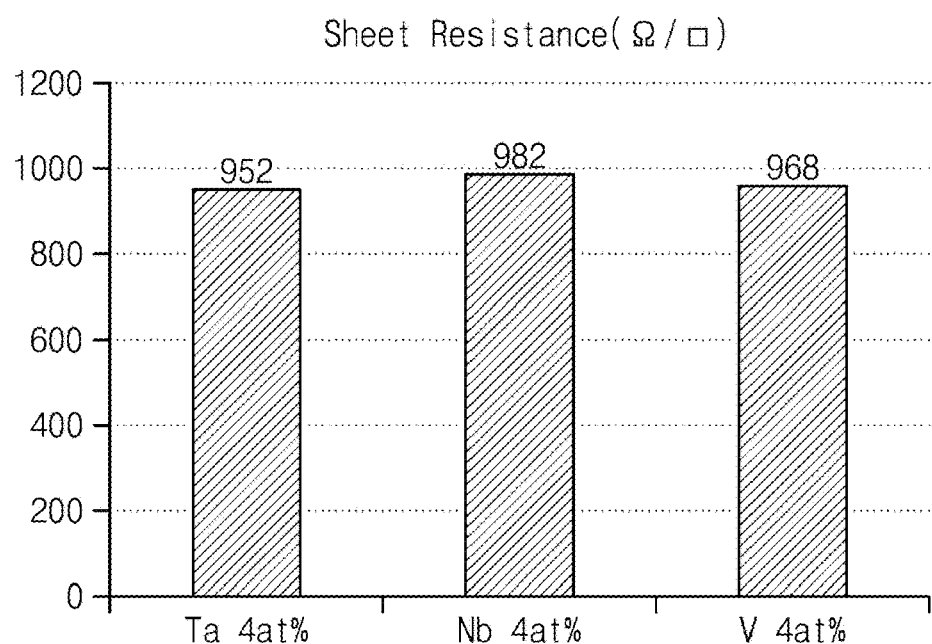
FIG. 3D is a graph showing sheet resistance of a metal oxide layer containing niobium or vanadium.
Figure 4:
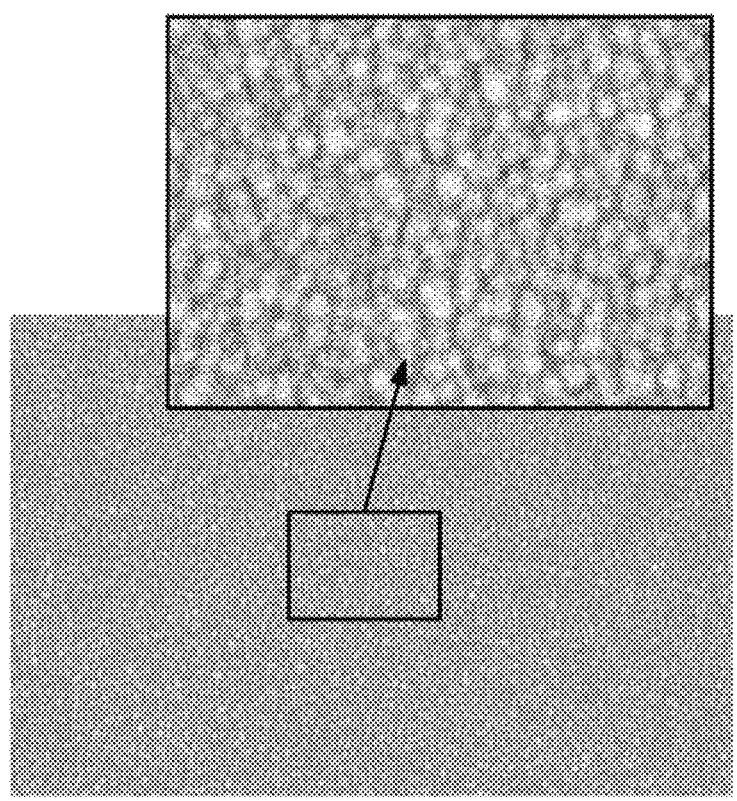
FIG. 4 is a scanning electron microscope (SEM) image of a first electrode according to some embodiments of the inventive concept.

FIGS. 1 and 2 are sectional views illustrating a light-emitting diode ED, according to some embodiments of the inventive concept. FIGS. 3A and 3B are graphs showing water solubility and sheet resistance of a metal oxide layer respectively, according to the content of tantalum. FIGS. 3C and 3D are graphs showing water solubility and sheet resistance of a metal oxide layer containing niobium or vanadium. FIG. 4 is a scanning electron microscope (SEM) image of a first electrode EL1 according to some embodiments of the inventive concept.

Referring to FIGS. 1 and 2, the light-emitting diode ED may include a first electrode EL1, a hole control layer HCL, a light-emitting layer EML, an electron control layer ECL, and a second electrode EL2, which are sequentially stacked on a base layer BL. In certain embodiments, at least one of the hole control layer HCL and the electron control layer ECL may be omitted (i.e., not included).

The base layer BL may be configured to provide a base surface, on which the light-emitting diode ED is placed. The base layer BL may be a glass substrate, a metal substrate, or a plastic substrate. The base layer BL may be an inorganic layer, an organic layer, or a composite material layer, which is provided on a substrate, but the inventive concept is not limited thereto.

The first electrode EL1 and the second electrode EL2 may be provided to face each other, and the hole control layer HCL, the light-emitting layer EML, the electron control layer ECL may be provided between the first electrode EL1 and the second electrode EL2. Although, in the present embodiment, the first electrode EL1 is illustrated to be closer to the base layer BL than the second electrode EL2, the inventive concept is not limited thereto. In certain embodiments, the first electrode EL1, the hole control layer HCL, the light-emitting layer EML, the electron control layer ECL, and the second electrode EL2 may be stacked on the base layer BL in a stacking order different from that shown in FIGS. 1 and 2 (e.g., in a reversed stacking order).

In some embodiments, the light-emitting diode ED may be an organic light-emitting diode or a quantum light-emitting diode. A light-emitting layer of the organic light-emitting diode may include an organic light-emitting material. A light-emitting layer of the quantum light-emitting diode may include quantum dots and/or quantum rods. For simplicity, the description that follows will refer to an example in which the light-emitting diode ED is the organic light-emitting diode.

In the present embodiment, the first electrode EL1 may be utilized as an anode. As shown in FIG. 1, the first electrode EL1 may include a reflection layer RL and a metal oxide layer MOL. The reflection layer RL may be provided between the metal oxide layer MOL and the base layer BL, and the metal oxide layer MOL may be provided between the reflection layer RL and the light-emitting layer EML.

The reflection layer RL may be formed of or include silver (Ag), magnesium (Mg), copper (Cu), aluminum (Al), platinum (Pt), lead (Pd), gold (Au), nickel (Ni), neodymium (Nd), iridium (Ir), chromium (Cr), lithium (Li), calcium (Ca), lithium fluoride/calcium (LiF/Ca), lithium fluoride/aluminum (LiF/Al), molybdenum (Mo), titanium (Ti), or compounds or mixtures thereof (e.g., a mixture of silver (Ag) and magnesium (Mg)). The reflection layer RL may be provided to have a double-layered structure containing at least two of the materials listed above.

The reflection layer RL may be configured to reflect light, which is generated in the light-emitting layer EML, toward the second electrode EL2 and to have uniform and high reflectance throughout the entire wavelength range of visible light (hereinafter, a first condition). In addition, the reflection layer RL may be configured in such a way that it can be patterned by a dry etching process (hereinafter, a second condition), and this may make it possible to reduce an area occupied by the first electrode EL1 and thereby realizing a high resolution display panel. When a wet etching process is utilized, due to a large Critical Dimension (CD) skew issue, it may be difficult to form an electrode with a small pitch.

In some embodiments, the reflection layer RL may be formed of or include aluminum. An aluminum-containing layer has uniform and high reflectance throughout the entire wavelength range of visible light and is easily reacted with a process gas to be utilized in a dry etching process. Since a compound of aluminum and a chlorine gas is volatilized at about 22° C., a reflection layer made of aluminum may be suitable for a dry etching process.

The reflection layer RL may have a thickness ranging from about 700 Å to about 1500 Å. When the reflection layer RL is thinner than 700 Å, a part of light incident into the reflection layer RL may pass through the reflection layer RL. By contrast, when the reflection layer RL is thicker than 1500 Å, grains of the reflection layer RL may cause a low reflectance issue.

The reflection layer RL may further include a metal oxide layer. For example, a portion (e.g., a top surface) of the reflection layer RL may be oxidized during a fabrication process of the light-emitting diode ED to form the metal oxide layer. The reflection layer RL and the metal oxide layer may contain the same metallic element. For example, when aluminum (Al) is utilized for the reflection layer RL, the reflection layer RL may further include an aluminum oxide layer. That is, the reflection layer RL may include an aluminum layer and an aluminum oxide layer on the aluminum layer. In the reflection layer RL, the aluminum oxide layer may be formed to have a very small and non-uniform thickness, compared with the aluminum layer.

The reflection layer RL may include an aluminum-nickel alloy, and this may prevent the reflection layer RL from being oxidized in a process of fabricating the light-emitting diode ED. The aluminum (Al) in the aluminum-nickel alloy may contribute to meeting the afore-described first and second conditions for the reflection layer RL, and the nickel (Ni) in the aluminum-nickel alloy may contribute to reducing or preventing the oxidation of the reflection layer RL.

A content of nickel (Ni) (i.e., number of nickel atoms) to a total amount (i.e., the total number of atoms) of the total reflection layer RL may range from 0.01 at % to 2.0 at %. If the content of nickel (Ni) is less than 0.01 at %, there may be a difficulty in reducing or preventing the oxidation of the total reflection layer RL, and if it is higher than 2.0 at %, the reflectance of the reflection layer RL may be decreased.

In some embodiments, palladium (Pd) and platinum (Pt) may be utilized to replace nickel (Ni) to reduce or prevent the reflection layer RL from being oxidized. For example, the reflection layer RL may include an aluminum-palladium alloy or an aluminum-platinum alloy. In certain embodiments, the reflection layer RL may include an alloy, in which aluminum (Al) and at least one of nickel (Ni), palladium (Pd), and platinum (Pt) are contained.

The reflection layer RL may include an aluminum-nickel-lanthanum alloy, and in this case, it may be possible to improve the oxidation-resistance and heat-resistance characteristics of the reflection layer RL. A high temperature process may be performed as a part of a process of fabricating the light-emitting diode ED or the display panel, but the lanthanum (La) in the aluminum-nickel-lanthanum alloy may prevent a hillock of the reflection layer RL, which may occur during such a high temperature process.

A content of lanthanum (La) (i.e., number of lanthanum atoms) to a total amount (i.e., total number of atoms) of the reflection layer RL may range from 0.01 at % to 1.0 at %. If the content of lanthanum (La) is less than 0.01 at %, the hillock-preventing effect may be reduced, and if it is higher than 1.0 at %, the reflectance of the reflection layer RL may be largely decreased.

In the present embodiment, the metal oxide layer MOL may be provided to be in direct contact with the reflection layer RL. The metal oxide layer MOL may be patterned by a dry etching process (i.e., the second condition), due to reasons similar to the reflection layer RL. In addition, the metal oxide layer MOL may be configured to have a high work-function (hereinafter, a third condition), and this may make it possible to utilize the metal oxide layer MOL for injection and transportation of holes. Furthermore, the metal oxide layer MOL may be configured to have low water solubility (hereinafter, a fourth condition), and in this case, it may be possible to prevent or substantially prevent the metal oxide layer MOL from being damaged in a subsequent wet process.

In consideration of the above conditions, the metal oxide layer MOL may include a first metal oxide and a second metal oxide. In some embodiments, the first metal oxide may be molybdenum oxide, and the second metal oxide may be an oxide of a group-V element. The molybdenum oxide may include molybdenum dioxide ($MoO_2$) whose conductivity is higher than that of molybdenum trioxide ($MoO_3$).

The molybdenum oxide may have a high work-function. For example, the molybdenum oxide may have a work-function of about 5.1 eV. The molybdenum oxide may have a higher work-function than ITO and IZO, each of which has a work-function of about 4.7 eV. However, since the molybdenum oxide has high water solubility, it may be damaged in a subsequent wet process (e.g., for forming an organic layer and the like). Since the metal oxide layer MOL further contains the oxide of the group-V element, it may be possible to decrease the water solubility of the metal oxide layer MOL and to prevent it from being damaged in a subsequent wet process.

FIG. 3A shows a change in water solubility of the metal oxide layer MOL containing molybdenum oxide and tantalum oxide. Here, the tantalum oxide was tantalum pentoxide ($Ta_2O_5$). The water solubility of the metal oxide layer MOL containing tantalum oxide had values that were lower than 20% (i.e., ⅕ times) the water solubility of a metal oxide layer, in which tantalum oxide is not contained.

As shown in FIG. 3A, when the atomic percent of tantalum (Ta) was lower than 2 at %, the water solubility had a greater value. This indicates that to ensure the reliability of the metal oxide layer MOL in a subsequent wet process, it is necessary to maintain an atomic percent of tantalum (Ta) to a total metal oxide layer to 2 at % or higher. In some embodiments, the metal oxide layer MOL may contain a mixture of molybdenum, tantalum, molybdenum oxide and tantalum oxide.

In some embodiments, an atomic percent of tantalum (Ta) to the total metal oxide layer may be lower than 10 at %, and in this case, it may be possible to realize the metal oxide layer MOL with a sufficiently high conductance. If the atomic percent of tantalum (Ta) is higher than 10 at %, the metal oxide layer MOL may have a work-function that is lower than a specific reference (e.g., predetermined or set) value. When the atomic percent of tantalum (Ta) is 2 at %, the metal oxide layer MOL having a thickness of 1000 Å may have a work-function of 5.5 eV, and the higher the atomic percent of tantalum (Ta), the lower the work-function of the metal oxide layer MOL.

FIG. 3B shows values of sheet resistance measured from a 2000 Å-thick metal oxide layer. The metal oxide layer had a sheet resistance higher than a reference value (i.e., 20000Ω/□), when the atomic percent of tantalum (Ta) was higher than 10 at %. In some embodiments, the metal oxide layer MOL may contain a mixture of molybdenum, tantalum, molybdenum oxide and tantalum oxide.

An atomic percent of molybdenum (Mo) to the total metal oxide layer may range from 35 at % to 45 at % (for example, from 38 at % to 42 at %). An atomic percent of oxygen (O) to the total metal oxide layer may range from 50 at % to 60 at % (for example, from 53 at % to 57 at %). An atomic percent of a group-V element to the total metal oxide layer may range from 2 at % to 10 at % (for example, from 2 at % to 7 at %).

In FIG. 3C, water solubility of a metal oxide layer containing molybdenum oxide and niobium oxide, and water solubility of a metal oxide layer containing molybdenum oxide and vanadium oxide are illustrated in comparison to the water solubility of the metal oxide layer MOL containing molybdenum oxide and tantalum oxide. The water solubility values of the metal oxide layers were evaluated in the same manner. A reference condition (tantalum 0 at %) in FIG. 3C is the same as that in FIG. 3A. In some embodiments, the metal oxide layer MOL may contain a mixture of molybdenum and the respective metal oxides.

The metal oxide layer containing molybdenum oxide and niobium oxide and the metal oxide layer containing molybdenum oxide and vanadium oxide had water solubility values similar to that of the metal oxide layer MOL containing molybdenum oxide and tantalum oxide.

In FIG. 3D, sheet resistance of a metal oxide layer containing molybdenum oxide and niobium oxide and sheet resistance of a metal oxide layer containing molybdenum oxide and vanadium oxide are illustrated in comparison to the sheet resistance of the metal oxide layer MOL containing molybdenum oxide and tantalum oxide. The sheet resistance values of the metal oxide layers were evaluated under the same condition. In some embodiments, the metal oxide layer MOL may contain a mixture of molybdenum and the respective metal oxides.

The metal oxide layer containing molybdenum oxide and niobium oxide and the metal oxide layer containing molybdenum oxide and vanadium oxide have sheet resistance values slightly higher than that of the metal oxide layer containing molybdenum oxide and tantalum oxide, but such a difference is not significant (i.e., there was no meaningful difference).

The metal oxide layer MOL containing molybdenum oxide and tantalum oxide may be suitable for a dry etching process. As shown in the following Table 1, a molybdenum fluorine (F) compound, a molybdenum chlorine (Cl) compound, a fluorine compound of group-V element, and a chlorine compound of group-V element are volatilized at temperature of 100° C. or lower, and thus, the second condition may be satisfied.

TABLE 1

| Compound | Volatilization Temperature (° C.) |
|---|---|
| Molybdenum Fluorine Compound | −100 |
| Molybdenum Chlorine Compound | 53 |
| Vanadium Fluorine Compound | −100 |
| Vanadium Chlorine Compound | 10 |
| Niobium Fluorine Compound | 66.5 |
| Niobium Chlorine Compound | 14.3 |
| Tantalum Fluorine Compound | −23 |
| Tantalum Chlorine Compound | 14.5 |

FIG. 4 is a scanning electron microscope (SEM) image of the metal oxide layer MOL containing molybdenum oxide and tantalum oxide. The metal oxide layer MOL may have an amorphous structure with a good surface flatness (e.g., smoothness). In some embodiments, the metal oxide layer MOL may contain a mixture of molybdenum and the respective metal oxides. The following Table 2 shows the analysis results of the metal oxide layer MOL.

TABLE 2

| Roughness (AFM analysis) | | Composition Ratio (XPS analysis) | | | Crystalline Structure |
|---|---|---|---|---|---|
| RMS (nm) | RPV (nm) | Mo (at %) | O (at %) | Ta (at %) | (XRD analysis) |
| 0.37 | 4.69 | 40.37 | 55.36 | 4.27 | Amorphous |

In some embodiments, the metal oxide layer MOL may include an oxide of an element X, where the element X contains one of titanium (Ti), tungsten (W), germanium (Ge), tin (Sn), selenium (Se), and zirconium (Zr). The oxide of titanium (Ti), tungsten (W), germanium (Ge), tin (Sn), selenium (Se), or zirconium (Zr) may have an insoluble property (e.g., may be insoluble in water). Since the metal oxide layer MOL contains molybdenum oxide and one of oxides of titanium (Ti), tungsten (W), germanium (Ge), tin (Sn), selenium (Se), and zirconium (Zr), it may have a work-function similar to that of ITO and IZO, and a water solubility lower than that of the molybdenum oxide. In the metal oxide layer MOL, an atomic percent of titanium (Ti), tungsten (W), germanium (Ge), tin (Sn), selenium (Se), or zirconium (Zr) to the total metal oxide may range from 2 at % to 10 at %.

In addition, a fluorine compound of titanium (Ti), tungsten (W), germanium (Ge), tin (Sn), or selenium (Se) and a chlorine compound of titanium (Ti), tungsten (W), germanium (Ge), tin (Sn), selenium (Se), zirconium (Zr) may have a volatilization temperature of 100° C. or lower, as shown in Table 3. Thus, the metal oxide layer MOL, in which molybdenum oxide and the oxide of one of titanium (Ti), tungsten (W), germanium (Ge), tin (Sn), selenium (Se), and zirconium (Zr), may be suitable for a dry etching process.

TABLE 3

| Compound | Volatilization Temperature (° C.) |
|---|---|
| Titanium Fluorine Compound | 45 |
| Titanium Chlorine Compound | −95 |
| Tungsten Fluorine Compound | −100 |
| Tungsten Chlorine Compound | 66.2 |
| Germanium Fluorine Compound | −100 |
| Germanium Chlorine Compound | −100 |
| Tin Fluorine Compound | −100 |
| Tin Chlorine Compound | −100 |
| Selenium Fluorine Compound | −100 |
| Selenium Chlorine Compound | −100 |
| Zirconium Chlorine Compound | 70 |

The metal oxide layer MOL may have a thickness ranging from about 30 Å to about 100 Å. If the thickness of the metal oxide layer MOL is less than 30 Å, due to inherent characteristics of a sputtering process, it may be difficult to realize uniformity in thickness of the metal oxide layer MOL, and if the thickness of the metal oxide layer MOL is larger than 100 Å, an amount of light, which is reflected by the reflection layer RL and is absorbed by the metal oxide layer MOL, may be greater than a reference (e.g., predetermined or set) amount.

Although not shown, the first electrode EL1 may further include a conductive layer which is provided in at least one of the regions (e.g., gap regions) positioned between the reflection layer RL and the base layer BL, between the reflection layer RL and the metal oxide layer MOL, or between the metal oxide layer MOL and the hole control layer HCL.

As shown in FIG. 2, the first electrode EL1 may further include an anti-oxidation layer AOL, which is provided between the reflection layer RL and the metal oxide layer MOL to reduce or prevent oxidation of the reflection layer RL. The anti-oxidation layer AOL may be directly provided on a top surface of the reflection layer RL. The anti-oxidation layer AOL may include at least one of the materials having a good acid resistant property (e.g., nickel (Ni), titanium (Ti), or compounds or mixtures thereof).

The anti-oxidation layer AOL may have a thickness ranging from about 10 Å to about 100 Å. If the anti-oxidation layer AOL is thinner than 10 Å, at least a portion of a top surface of the reflection layer RL may be exposed to the outside, and if the anti-oxidation layer AOL is thicker than 100 Å, an amount of light, which is reflected by the reflection layer RL and is absorbed by the anti-oxidation layer AOL, may be greater than the reference (e.g., predetermined or set) amount.

As shown in FIGS. 1 and 2, the hole control layer HCL may be provided on the first electrode EL1. The hole control layer HCL may include at least one of a hole injection layer HIL, a hole transport layer HTL, a hole buffer layer, and an electron blocking layer. The hole control layer HCL may have a thickness ranging, for example, from about 1000 Å to about 1500 Å.

The hole control layer HCL may be provided in the form of a single layer, which is formed of a single material or of a plurality of different materials; or a multi-layered structure including a plurality of layers, which are formed of a plurality of different materials.

For example, the hole control layer HCL may have a single-layered structure to provide one of the hole injection layer HIL and the hole transport layer HTL. Alternatively, the hole control layer HCL may have a single-layered structure, which is formed of a plurality of different materials. For example, the hole control layer HCL may contain both of a hole injection material and a hole transportation material. According to another embodiment, the hole control layer HCL may have a multi-layered structure, such as the structure of hole injection layer HIL/hole transport layer HTL, of hole injection layer HIL/hole transport layer HTL/hole buffer layer, of hole injection layer HIL/hole buffer layer, of hole transport layer HTL/hole buffer layer, or of hole injection layer HIL/hole transport layer HTL/electron blocking layer, which are sequentially stacked on the first electrode EL1, but the inventive concept is not limited thereto.

The hole control layer HCL may be formed by various suitable methods, such as a vacuum deposition method, a spin coating method, a cast method, a Langmuir-Blodgett method, an inkjet printing method, a laser printing method, and/or a laser-induced thermal imaging (LITI) method.

When the hole control layer HCL contains a hole injection material, the hole control layer HCL may include, for example, triphenylamine-containing polyether ketone (TPA-PEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methyl phenyl phenylamino) triphenylamine (m-MTDATA), N,N'-di(1-naphthyl)-N,N'-diphenylbenzidine (NPB), 4,4',4''-tris{N,N-diphenyl amino}triphenylamine (TDATA), 4,4',4''-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), and/or the like. However, the inventive concept is not limited thereto.

When the hole control layer HCL contains a hole transportation material, the hole control layer HCL may include, for example, 1,1-bis[(di-4-tolylamino)phenyl]cyclohexane (TAPC), a carbazole derivative (such as N-phenylcarbazole and polyvinyl carbazole), N,N'-bis(3-methylphenyl)-N,N'-diphenyl-[1,1-biphenyl]-4,4'-diamine (TPD), 4,4',4''-tris(N-carbazolyl)-triphenylamine (TCTA), N,N'-di(1-naphthyl)-N,N'-diphenylbenzidine (NPB), and/or the like. However, the inventive concept is not limited thereto.

The hole control layer HCL may be provided to have a thickness ranging from about 100 Å to about 10000 Å (for example, from about 100 Å to about 1000 Å). When the hole control layer HCL is configured to include both of the hole injection layer HIL and the hole transport layer HTL, the hole injection layer HIL may have a thickness ranging from about 100 Å to about 10000 Å (for example, from about 100 Å to about 1000 Å) and the hole transport layer HTL may have a thickness ranging from about 30 Å to about 1000 Å. In one embodiment, when the thicknesses of the hole control layer HCL, the hole injection layer HIL, and the hole transport layer HTL are within the above described range, it may be possible to achieve a satisfactory hole transportation property without a substantial increase in the driving voltage.

The hole control layer HCL may further include a charge producing material for increasing conductivity, in addition to the afore-mentioned materials. The charge producing material may be uniformly or non-uniformly distributed in the hole control layer HCL. The charge producing material may be, for example, p-dopants. The p-dopants may be one of quinone derivatives, metal oxides, and cyano-containing compounds, but the inventive concept is not limited thereto. For example, the p-dopants may include quinone derivatives (such as TCNQ (Tetracyanoquinodimethane) and F4-TCNQ (2,3,5,6-tetrafluoro-tetracyanoquinodimethane)), and metal oxides (such as tungsten oxide and molybdenum oxide), but the inventive concept is not limited thereto.

As described above, the hole control layer HCL may further include at least one of the hole buffer layer and the electron blocking layer, in addition to the hole injection layer HIL and the hole transport layer HTL. The hole buffer layer may be configured to compensate a resonance distance, which varies depending on the wavelength of light emitted from the light-emitting layer EML, and thus, the hole buffer layer may contribute to increase the light emission efficiency. The hole buffer layer may be formed of or include a suitable material that is contained in the hole control layer HCL. The electron blocking layer may be configured to reduce or prevent electrons from being injected from the electron control layer ECL into the hole control layer HCL.

The light-emitting layer EML may be provided on the hole control layer HCL. The light-emitting layer EML may have a thickness ranging, for example, from about 100 Å to about 300 Å. The light-emitting layer EML may be provided in the form of a single layer, which is formed of a single material or of a plurality of different materials, or a multi-layered structure including a plurality of layers, which are formed of a plurality of different materials.

The light-emitting layer EML may be configured to emit one of red, green, blue, white, yellow, and cyan lights. The light-emitting layer EML may include a fluorescent material or a phosphorescent material. The light-emitting layer EML may include an arylamine compound, an pyrene compound, and/or a styryl compound.

Furthermore, the light-emitting layer EML may contain a host and a dopant. The host may include, for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4', 4''-tris(carbazol-9-yl)-triphenylamine (TCTA), 1,3,5-tri(N-phenylbenzoimidazole-2-yl)benzene (TPBi), 3-tert-butyl-9, 10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), and/or the like, but the inventive concept is not limited thereto.

The dopant may include, for example, a styryl derivative (e.g., 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenyl-ben zenamine (N-BDAVBi)), a perylene derivative (e.g., 2,5,8,11-tetra-t-butylperylene (TBP)), and/or a pyrene derivative (e.g., 1,1-dipyrene, 1,4-dipyrenylbenzene, and 1,4-bis(N,N-Diphenylamino)pyrene).

When the light-emitting layer EML is utilized to emit red light, the light-emitting layer EML may include a fluorescent material containing, for example, PBD:Eu(DBM)3(Phen)

(tris(dibenzoylmethanato)phenanthoroline europium) or perylene. When the light-emitting layer EML is utilized to emit red light, dopants contained in the light-emitting layer EML may be selected from, for example, a metal complex or an organometallic complex (such as, PIQIr (acac)(bis(1-phenylisoquinoline)acetylacetonate iridium), PQIr (acac)(bis(1-phenylquinoline)acetylacetonate iridium), PQIr(tris(1-phenylquinoline)iridium), and PtOEP (octaethylporphyrin platinum)), rubrene and derivatives thereof, and 4-dicyanomethylene-2-(p-dimethylaminostyryl)-6-methyl-4H-pyran (DCM) and derivatives thereof.

When the light-emitting layer EML is utilized to emit green light, the light-emitting layer EML may include a fluorescent material containing, for example, tris(8-hydroxyquinolino)aluminum (Alq3). When the light-emitting layer EML is utilized to emit green light, dopants contained in the light-emitting layer EML may be selected from, for example, a metal complex or an organometallic complex (e.g., Ir(ppy)3(fac-tris(2-phenylpyridine)iridium)), and coumarin and derivatives thereof.

When the light-emitting layer EML is utilized to emit blue light, the light-emitting layer EML may include, for example, a fluorescent material containing one selected from spiro-DPVBi, spiro-6P, distyryl-benzene (DSB), distyryl-arylene (DSA), polyfluorene (PFO) polymers, and poly(p-phenylene vinylene) (PPV) polymers. When the light-emitting layer EML is utilized to emit blue light, dopants contained in the light-emitting layer EML may be selected from, for example, a metal complex or an organometallic complex (e.g., (4,6-F2ppy)2Irpic), and perylene and derivatives thereof.

The electron control layer ECL may be provided on the light-emitting layer EML. The electron control layer ECL may include at least one of the electron blocking layer, an electron transport layer ETL, and an electron injection layer EIL, but the inventive concept is not limited thereto.

The electron control layer ECL may be provided in the form of a single layer, which is formed of a single material or of a plurality of different materials, or a multi-layered structure including a plurality of layers, which are formed of a plurality of different materials.

For example, the electron control layer ECL may have a single-layered structure to provide one of the electron injection layer EIL and the electron transport layer ETL. Alternatively, the electron control layer ECL may have a single-layered structure, which is formed of a plurality of different materials. For example, the electron control layer ECL may contain both of an electron injection material and an electron transportation material. According to another embodiment, the electron control layer ECL may have a multi-layered structure, such as a structure of electron transport layer ETL/electron injection layer EIL or of hole blocking layer/electron transport layer ETL/electron injection layer EIL, which are sequentially stacked on the first electrode EL1, but the inventive concept is not limited thereto. The electron control layer ECL may have a thickness ranging, for example, from about 100 Å to about 1500 Å.

The electron control layer ECL may be formed by at least one of various suitable methods, such as a vacuum deposition method, a spin coating method, a casting method, a Langmuir-Blodgett (LB) method, an inkjet printing method, a laser printing method, and a laser-induced thermal imaging (LITI) method.

When the electron control layer ECL includes the electron transport layer ETL, the electron control layer ECL may include Alq3(tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi(1,3,5-tri(1-phenyl-1H-benzo[d]imidazol-2-yl)benzene), BCP(2,9-dimethyl-4,7-diphenyl-1,10-phenanthroline), Bphen(4,7-diphenyl-1,10-phenanthroline), TAZ(3-(4-biphenylyl)-4-phenyl-5-tert-butylphenyl-1,2,4-triazole), NTAZ(4-(naphthalen-1-yl)-3,5-diphenyl-4H-1,2,4-triazole), tBu-PBD(2-(4-biphenylyl)-5-(4-tert-butylphenyl)-1,3,4-oxadiazole), BAlq(Bis(2-methyl-8-quinolinolato-N1,O8)-(1,1'-biphenyl-4-olato)aluminum), Bebq2(berylliumbis(benzoquinolin-10-olate), ADN(9,10-di(naphthalene-2-yl)anthracene), and mixtures thereof, but the inventive concept is not limited thereto.

When the electron control layer ECL includes the electron transport layer ETL, the electron transport layer ETL may have a thickness ranging from about 100 Å to about 1000 Å (for example, from about 150 Å to about 500 Å). When the electron transport layer ETL is provided to meet the above thickness condition, it may be possible to achieve a satisfactory electron transportation property without a substantial increase in the driving voltage.

When the electron control layer ECL includes the electron injection layer EIL, the electron control layer ECL may include LiF, lithium quinolate (Liq), $Li_2O$, BaO, NaCl, CsF, lanthanides (e.g., Yb), and/or metal halides (e.g., RbCl, RbI, KI), but the inventive concept is not limited thereto. The electron injection layer EIL may be formed of a mixture material, in which an electron transportation material and an insulating organometallic salt are mixed. The organometallic salt may be a material whose energy band gap is about 4 eV or higher. In more detail, the organometallic salt may include, for example, metal acetate, metal benzoate, metal acetoacetate, metal acetylacetonate, and/or metal stearate.

When the electron control layer ECL includes the electron injection layer EIL, the electron injection layer EIL may have a thickness ranging from about 1 Å to about 100 Å (for example, from about 3 Å to about 90 Å). When the electron injection layer EIL is provided to meet the above thickness condition, it may be possible to achieve a satisfactory electron injection property without a substantial increase in the driving voltage.

The electron control layer ECL may include a hole blocking layer, as described above. The hole blocking layer may include at least one of, for example, BCP (2,9-dimethyl-4,7-diphenyl-1,10-phenanthroline) or Bphen (4,7-diphenyl-1,10-phenanthroline), but the inventive concept is not limited thereto.

The second electrode EL2 may be provided on the electron control layer ECL. In the present embodiment, the second electrode EL2 may be utilized as a cathode. The second electrode EL2 may be formed of a metal alloy or a conductive compound. The second electrode EL2 is a transmission electrode. When the second electrode EL2DL is the transmission electrode, the second electrode EL2 may be formed of a transparent metal oxide material (e.g., indium tin oxide (ITO), indium zinc oxide (IZO), zinc oxide (ZnO), and/or indium tin zinc oxide (ITZO)).

Although not shown, the second electrode EL2 may be connected to an auxiliary electrode. If the second electrode EL2 is connected to the auxiliary electrode, the resistance of the second electrode EL2 may be decreased.

If voltages are applied to the first electrode EL1 and the second electrode EL2 of the light-emitting diode ED, holes may be injected into the light-emitting layer EML from the first electrode EL1 through the hole control layer HCL, and electrons may be injected into the light-emitting layer EML from the second electrode EL2 through the electron control layer ECL. In the light-emitting layer EML, the electrons and the holes may be recombined with each other, thereby producing excitons. When the excitons make a transition from an excited state to a ground state, light may be emitted from the light-emitting layer EML.

Figure 5A:
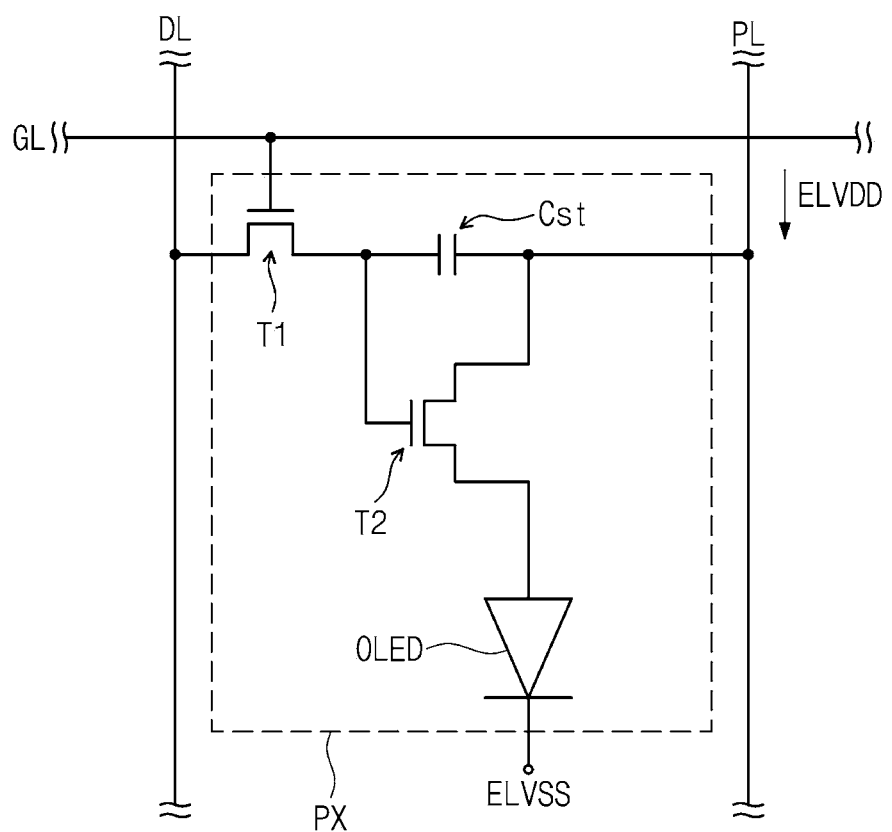
FIG. 5A is an equivalent circuit diagram of a pixel according to some embodiments of the inventive concept.
Figure 5B:
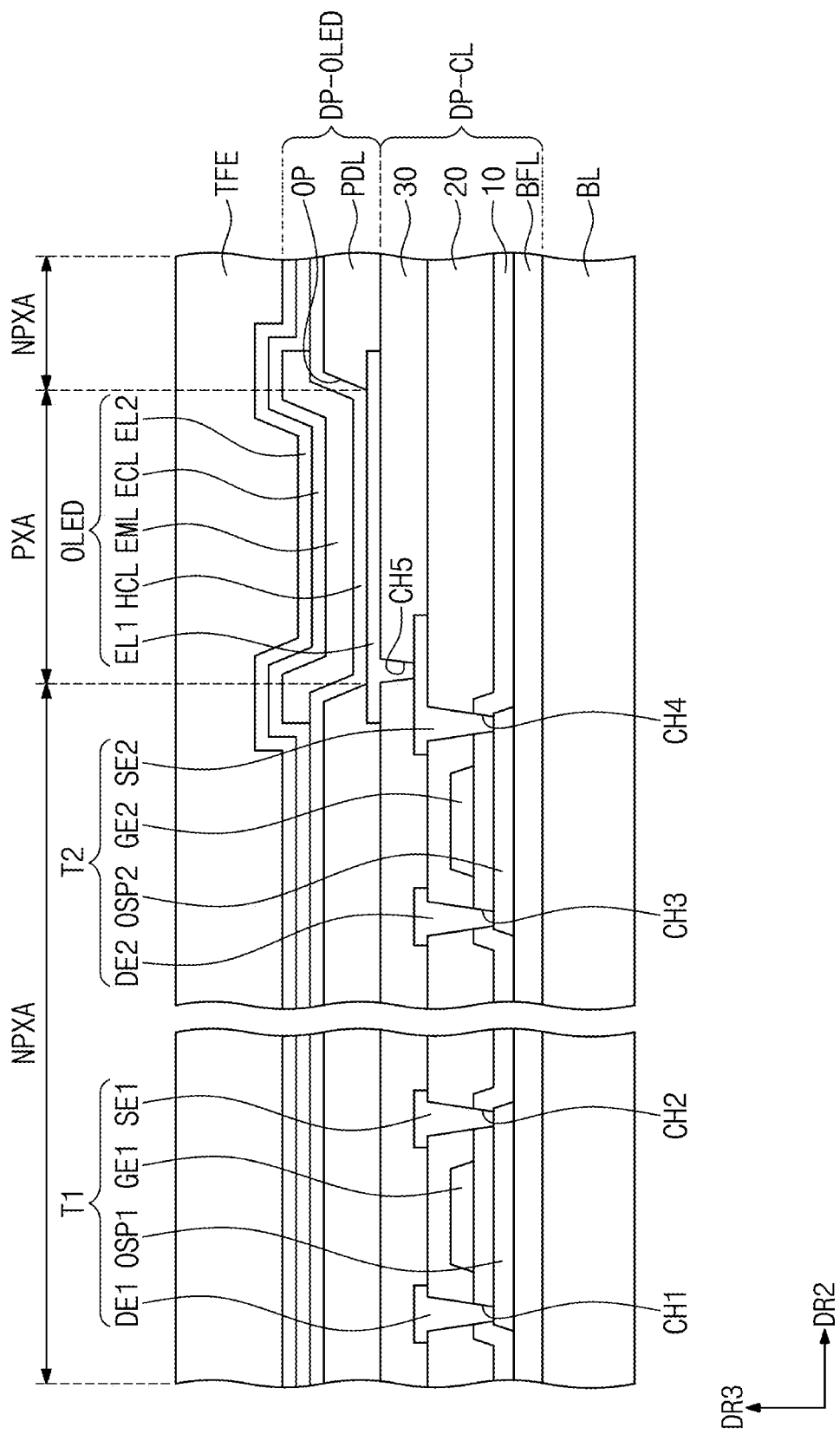
FIG. 5B is a sectional view of a display panel according to some embodiments of the inventive concept.

FIG. 5A is an equivalent circuit diagram of a pixel PX, according to some embodiments of the inventive concept. FIG. 5B is a sectional view of a display panel DP, according to some embodiments of the inventive concept.

FIG. 5A illustrates a scan line GL, a data line DL, a power line PL, and a pixel PX connected thereto. The structure of the pixel PX is not limited to the example of FIG. 5A and may be variously changed.

The pixel PX may include a first transistor T1 (or a switching transistor), a second transistor T2 (or a driving transistor), and a capacitor Cst, which are utilized as parts of a pixel driving circuit for driving the light-emitting diode ED. For simplicity, the description that follows will refer to an example in which the light-emitting diode ED is the organic light-emitting diode. A first power voltage ELVDD may be provided to the second transistor T2, and a second power voltage ELVSS may be provided to the organic light-emitting diode ED. The second power voltage ELVSS may be lower than the first power voltage ELVDD.

The first transistor T1 may be configured to output a data signal applied to the data line DL, in response to a scan signal applied to the scan line GL. The capacitor Cst may be charged to have a voltage corresponding to the data signal received from the first transistor T1. The second transistor T2 may be connected to the organic light-emitting diode ED. The second transistor T2 may be utilized to control a driving current flowing through the organic light-emitting diode ED, in response to an amount of electric charges stored in the capacitor Cst.

The equivalent circuit diagram shown in FIG. 5A is one of the possible embodiments of the inventive concept, but the inventive concept is not limited thereto. For example, the pixel PX may be configured to further include a plurality of transistors or at least one additional capacitor. In certain embodiments, the organic light-emitting diode ED may be coupled between the power line PL and the second transistor T2.

FIG. 5B is a sectional view illustrating a portion of the display panel DP corresponding to the equivalent circuit diagram of FIG. 5B. A circuit device layer DP-CL, a display device layer DP-OLED, and a thin-film encapsulation layer TFE may be sequentially provided on the base layer BL. In the present embodiment, the thin-film encapsulation layer TFE may be replaced with an encapsulation substrate, and/or the like.

In the present embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material. The inorganic and organic materials for the circuit device layer DP-CL are not limited to specific materials, and in certain embodiments, the buffer layer BFL may be selectively omitted (i.e., may not be included).

A semiconductor pattern OSP1 of the first transistor T1 (hereinafter, a first semiconductor pattern) and a semiconductor pattern OSP2 of the second transistor T2 (hereinafter, a second semiconductor pattern) may be provided on the buffer layer BFL. The first semiconductor pattern OSP1 and the second semiconductor pattern OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. A control electrode GE1 of the first transistor T1 (hereinafter, a first control electrode) and a control electrode GE2 of the second transistor T2 (hereinafter, a second control electrode) may be provided on the first intermediate inorganic layer 10. The first control electrode GE1 and the second control electrode GE2 may be fabricated by substantially the same photolithography process as that for the scan lines GL (e.g., see FIG. 5A).

The second intermediate inorganic layer 20 may be provided on the first intermediate inorganic layer 10 to cover the first control electrode GE1 and the second control electrode GE2. An input electrode DE1 and an output electrode SE1 of the first transistor T1 (hereinafter, a first input electrode and a first output electrode) and an input electrode DE2 and an output electrode SE2 of the second transistor T2 (hereinafter, a second input electrode and a second output electrode) may be provided on the second intermediate inorganic layer 20.

The first input electrode DE1 and the first output electrode SE1 may be connected to the first semiconductor pattern OSP1, respectively, through a first penetration hole CH1 and a second penetration hole CH2, which are formed to penetrate the first intermediate inorganic layer 10 and the second intermediate inorganic layer 20. The second input electrode DE2 and the second output electrode SE2 may be connected to the second semiconductor pattern OSP2, respectively, through a third penetration hole CH3 and a fourth penetration hole CH4, which are formed to penetrate the first intermediate inorganic layer 10 and the second intermediate inorganic layer 20. In certain embodiments, at least one of the first transistor T1 and the second transistor T2 may be provided to have a bottom gate structure.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface (e.g., a flat top surface).

The display device layer DP-OLED may be provided on the intermediate organic layer 30. The display device layer DP-OLED may include a pixel definition layer PDL and the organic light-emitting diode ED. The organic light-emitting diode ED may be configured to have substantially the same features as one of the light-emitting devices described with reference to FIGS. 1 to 3B.

The pixel definition layer PDL may be formed of or include an organic material. The first electrode EL1 may be provided on the intermediate organic layer 30. The first electrode EL1 may be connected to the second output electrode SE2 through a fifth penetration hole CH5, which is formed to penetrate the intermediate organic layer 30. An opening OP may be defined in the pixel definition layer PDL. The opening OP of the pixel definition layer PDL may be defined to expose at least a portion of the first electrode EL1. In certain embodiments, the pixel definition layer PDL may be omitted (i.e., may not be included).

The pixel PX may be provided on a display region DP-DA. The display region DP-DA may include a light-emitting region PXA and a non-light-emitting region NPXA adjacent to the light-emitting region PXA. The non-light-emitting region NPXA may be provided to enclose (e.g., surround) the light-emitting region PXA. In the present embodiment, the light-emitting region PXA may be defined to correspond to a portion of the first electrode EL1 exposed by the opening OP.

In some embodiments, the light-emitting region PXA may be overlapped with at least one of the first and second transistors T1 and T2. For example, the opening OP may be enlarged, and not only the first electrode EL1 but also the light-emitting layer EML to be described below may also be enlarged.

The hole control layer HCL may be provided in common (e.g., as a continuous layer) on the light-emitting region PXA and the non-light-emitting region NPXA. Although not shown, a common layer, such as the hole control layer HCL, may be formed in common (e.g., as a continuous layer) on the non-light-emitting region NPXA and light-emitting regions PXA-R, PXA-G, and PXA-B (e.g., see FIG. 6A).

The light-emitting layer EML may be provided on a region corresponding to the opening OP. In the present embodiment, the light-emitting layer EML is illustrated to have a patterned structure, but in certain embodiments, the light-emitting layer EML may be provided in common on the light-emitting regions PXA-R, PXA-G, and PXA-B (e.g., see FIG. 6A) (e.g., the light-emitting layer EML may be provided as one continuous layer on the light-emitting regions PXA-R, PXA-G, and PXA-B, and the non-light-emitting region NPXA located between the light-emitting regions). Here, the light-emitting layer EML may be configured to generate white-color light. Also, the light-emitting layer EML may have a multi-layered structure, referred to as "tandem".

The thin-film encapsulation layer TFE may be provided on the second electrode EL2. The thin-film encapsulation layer TFE may be provided in common (e.g., as a continuous layer) on the non-light-emitting region NPXA and the light-emitting regions PXA-R, PXA-G, and PXA-B (e.g., see FIG. 6A). In the present embodiment, the thin-film encapsulation layer TFE may be provided to directly cover the second electrode EL2. In certain embodiments, a capping layer may be further provided between the thin-film encapsulation layer TFE and the second electrode EL2 to cover the second electrode EL2. Here, the thin-film encapsulation layer TFE may be provided to directly cover the capping layer.

In some embodiments, the organic light-emitting diode ED may further include a resonance structure, which may be utilized to control a resonance distance of light emitted from the light-emitting layer EML. The resonance structure may be provided between the first electrode EL1 and the second electrode EL2, and a thickness of the resonance structure may be determined, depending on a wavelength of light to be emitted from the light-emitting layer EML.

Figure 6A:
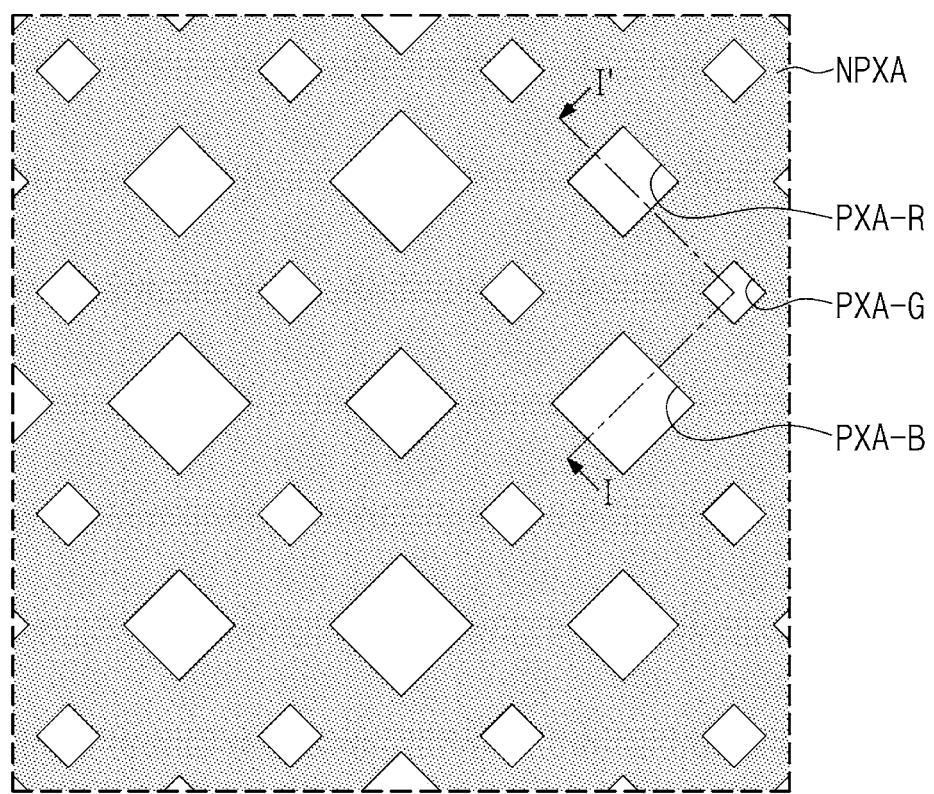
FIG. 6A is a plan view of a display panel according to some embodiments of the inventive concept.
Figure 6B:
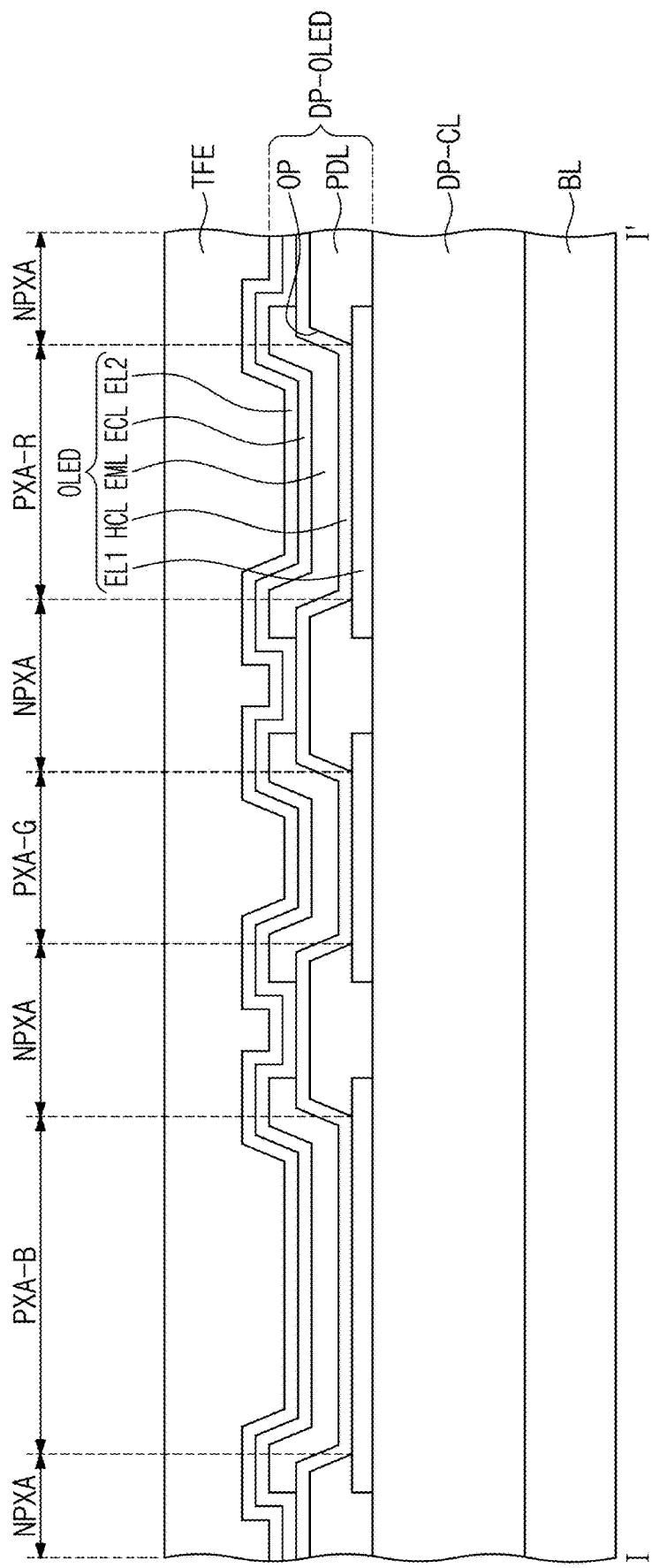
FIG. 6B is a sectional view taken along the line I-I' of FIG. 6A.

FIG. 6A is a plan view of the display panel DP according to some embodiments of the inventive concept. FIG. 6B is a sectional view taken along the line I-I' of FIG. 6A.

As shown in FIGS. 6A and 6B, the display panel DP may include the non-light-emitting region NPXA and the light-emitting regions PXA-R, PXA-G, and PXA-B. Each of the light-emitting regions PXA-R, PXA-G, and PXA-B may be configured to have substantially the same features as the light-emitting region PXA described with reference to FIGS. 5A and 5B.

The light-emitting regions PXA-R, PXA-G, and PXA-B may be classified into a plurality of groups, depending on the color of light emitted from the organic light-emitting diodes ED thereof. FIG. 6B illustrates an example in which the light-emitting regions PXA-R, PXA-G, and PXA-B are classified into three groups and are configured to emit red, green, and blue lights, respectively.

According to the color of light emitted from the light-emitting layer EML of the organic light-emitting diode ED, the light-emitting regions PXA-R, PXA-G, and PXA-B may have different areas (e.g., different surface areas). The light-emitting region PXA-B of an organic light-emitting diode, which is configured to emit blue light, may have the largest area, and the light-emitting region PXA-G of an organic light-emitting diode, which is configured to emit green light, may have the smallest area.

FIGS. 7A to 7H are sectional views illustrating a process of fabricating the display panel DP, according to some embodiments of the inventive concept. FIGS. 7A to 7H illustrate vertical sections corresponding to FIG. 6B. For concise description, an element that has previously been described with reference to FIGS. 5A to 6B may be identified by a similar or identical reference number without repeating an overlapping description thereof.

Figure 7A:
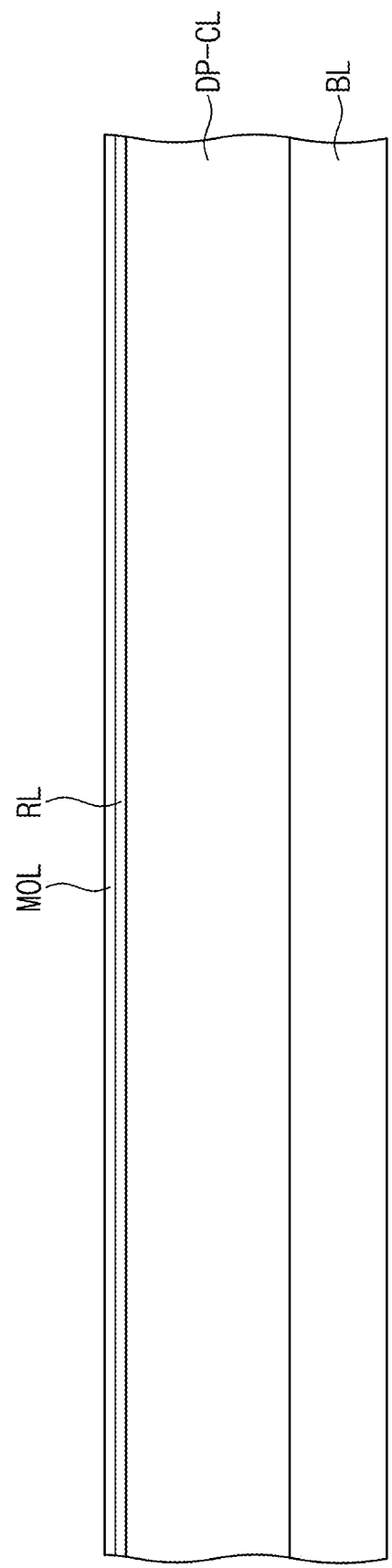
FIGS. 7A to 7H are sectional views illustrating a process of fabricating a display panel, according to some embodiments of the inventive concept.

As shown in FIG. 7A, the reflection layer RL may be formed on the circuit device layer DP-CL. The topmost layer of insulating layers constituting the circuit device layer DP-CL (e.g., the intermediate organic layer 30 shown in FIG. 5A) may be utilized as a base layer, on which the reflection layer RL is formed. The reflection layer RL may be formed to be overlapped with a plurality of the light-emitting regions PXA-R, PXA-G, and PXA-B and the non-light-emitting region NPXA.

The reflection layer RL may be formed by a physical vapor deposition method, a chemical vapor deposition method, an atomic layer deposition method, and/or the like, but the inventive concept is not limited thereto. In some embodiments, the reflection layer RL may be formed by a sputtering method, which is one of the physical vapor deposition methods. The reflection layer RL may be an aluminum layer or an aluminum alloy layer, as described with reference to FIGS. 1 to 4.

As shown in FIG. 7A, the metal oxide layer MOL may be formed on the reflection layer RL. The metal oxide layer MOL may be formed to be overlapped with a plurality of the light-emitting regions PXA-R, PXA-G, and PXA-B and the non-light-emitting region NPXA. The metal oxide layer MOL may be formed by a physical vapor deposition method, a chemical vapor deposition method, an atomic layer deposition method, and/or the like, but the inventive concept is not limited thereto. The metal oxide layer MOL may be configured to include the first metal oxide and the second metal oxide, as described with reference to FIGS. 1 to 4.

In the present embodiment, the metal oxide layer MOL may be formed utilizing a sputtering method. A display panel, which is provided with the reflection layer RL but is in an unfinished state (or in process), may be placed in in a vacuum chamber, and a DC power may be applied to a target material. Argon and oxygen gases may be injected into the chamber.

The target material may include molybdenum dioxide ($MoO_2$). The molybdenum oxide may contain tantalum that is mixed in the form of metal particles having a diameter from about 40 μm to 60 μm. An atomic percent of molybdenum to the total target material may range from 35 at % to 45 at % (for example, from 38 at % to 42 at %). An atomic percent of oxygen to the total target material may range from 50 at % to 60 at % (for example, from 53 at % to 57 at %). An atomic percent of a group-V element to the total target material may range from 2 at % to 10 at % (for example, from 2 at % to 7 at %).

Figure 7B:
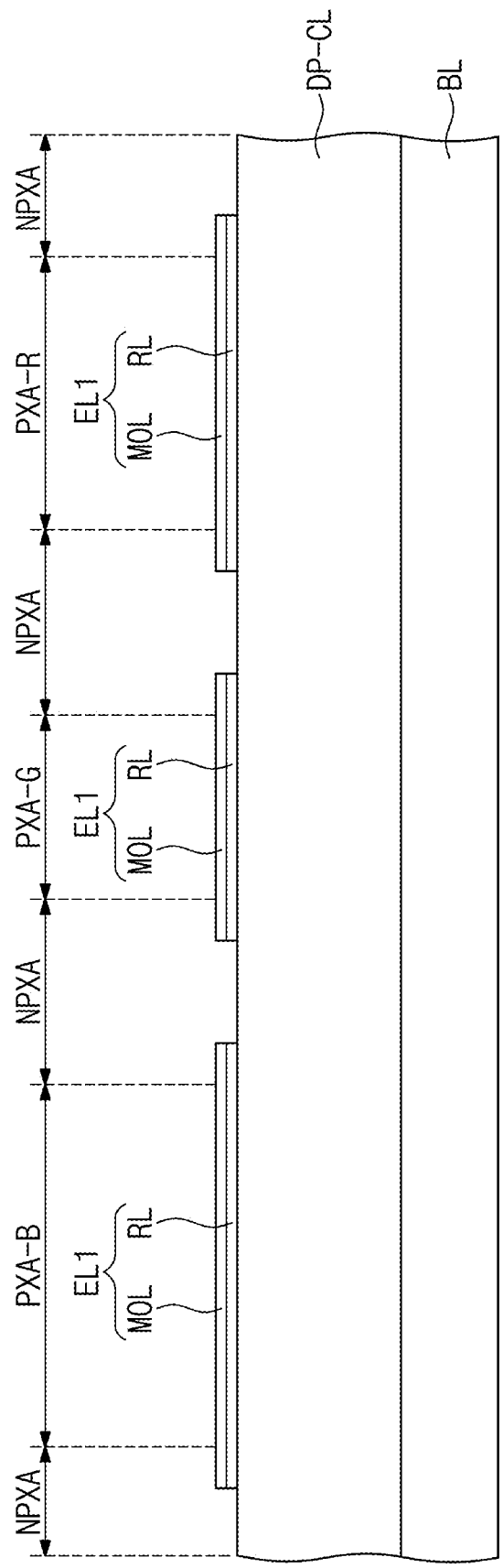

As shown in FIG. 7B, the reflection layer RL and the metal oxide layer MOL may be patterned to form the first electrodes EL1. Both of the reflection layer RL and the metal oxide layer MOL may be etched by a single dry etching process (e.g., simultaneously or concurrently).

A photoresist mask pattern may be formed on the reflection layer RL and the metal oxide layer MOL. The photoresist mask pattern may be formed to have a plurality of openings defining positions and shapes of the first electrodes EL1.

Under a plasma environment, a fluorine gas ($F_2$) and/or a chlorine gas ($Cl_2$) may be injected into the chamber. The fluorine gas ($F_2$) may be supplied in the form of sulfur hexafluoride ($SF_6$) gas. If necessary, an oxygen gas ($O_2$) may be additionally injected into the chamber.

The fluorine gas ($F_2$) and/or the chlorine gas ($Cl_2$) may react with molybdenum, tantalum, and/or aluminum. Since a fluorine compound of molybdenum, tantalum, or aluminum, or a chlorine compound of molybdenum, tantalum, or aluminum has a volatilization temperature of 100° C. or lower, a dry etching process thereon may be easily performed. Also, as previously described with reference to Tables 1 and 3, because a fluorine compound of vanadium, niobium, titanium, tungsten, germanium, tin, or selenium or a chlorine compound of vanadium, niobium, titanium, tungsten, germanium, tin, or selenium has a volatilization temperature of 100° C. or lower, a dry etching process thereon may also be easily performed.

Although not shown, in certain embodiments, an act of forming the anti-oxidation layer AOL (e.g., see FIG. 2) may be further performed between act of forming the reflection layer RL and the act of forming the metal oxide layer MOL. The anti-oxidation layer AOL may be formed by a physical vapor deposition method, a chemical vapor deposition method, an atomic layer deposition method, and the like. The anti-oxidation layer AOL may be etched during the dry etching process for etching the reflection layer RL and the metal oxide layer MOL or may be separately patterned by an additional etching process.

Figure 7C:
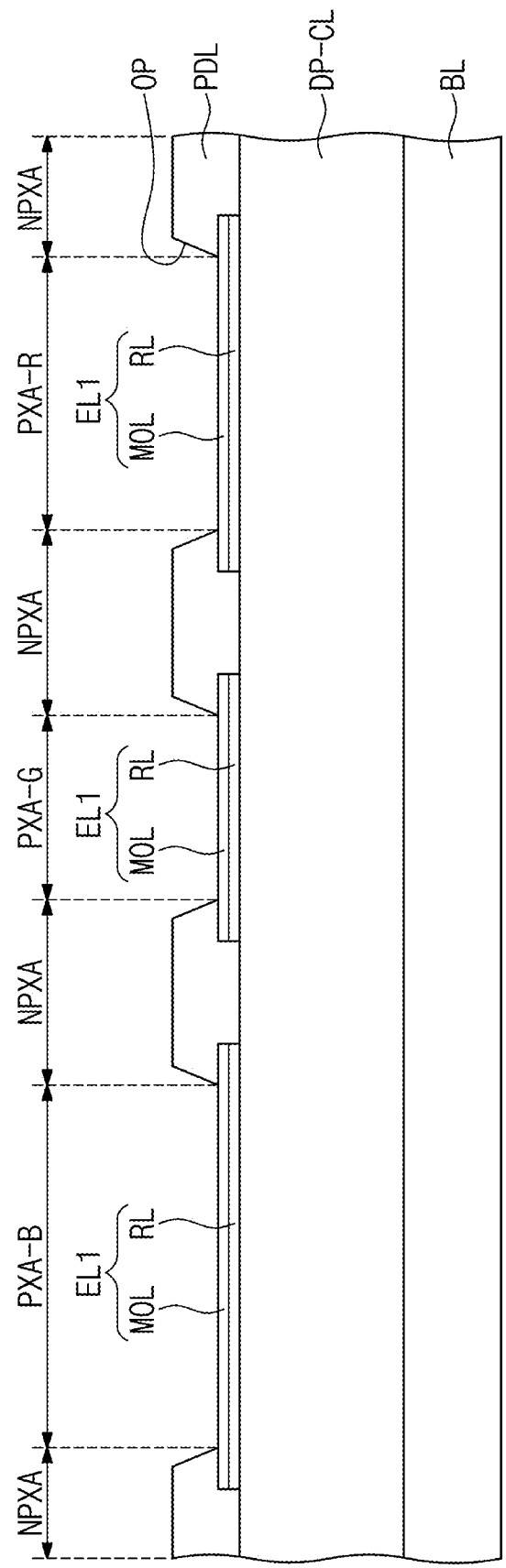

As shown in FIG. 7C, the pixel definition layer PDL may be formed on the circuit device layer DP-CL. The pixel definition layer PDL may be overlapped with the non-light-emitting region NPXA, and a plurality of openings OP may be formed in the pixel definition layer PDL to expose the plurality of first electrodes EL1.

A preliminary pixel definition layer may be formed to cover the circuit device layer DP-CL provided with the first electrodes EL1 and then may be patterned utilizing a photolithography process. The patterning process may be performed in a wet etching manner. The patterning process may be performed under a high temperature environment, and when the reflection layer RL is provided to include lanthanum (La), a hillock issue of the reflection layer RL, which may occur under the high temperature environment, may be prevented or substantially prevented.

Figure 7D:
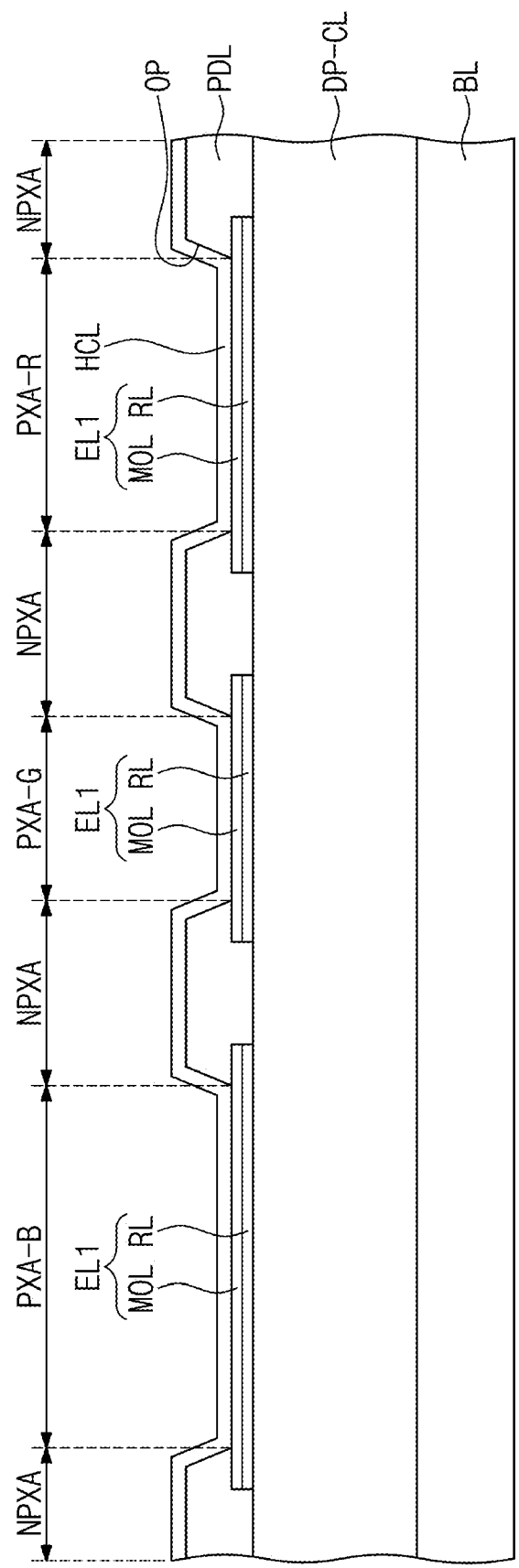

As shown in FIG. 7D, the hole control layer HCL may be formed on the circuit device layer DP-CL. The hole control layer HCL may be formed in common (e.g., as a continuous layer) on the non-light-emitting region NPXA and the plurality of the light-emitting regions PXA-R, PXA-G, and PXA-B.

Figure 7E:
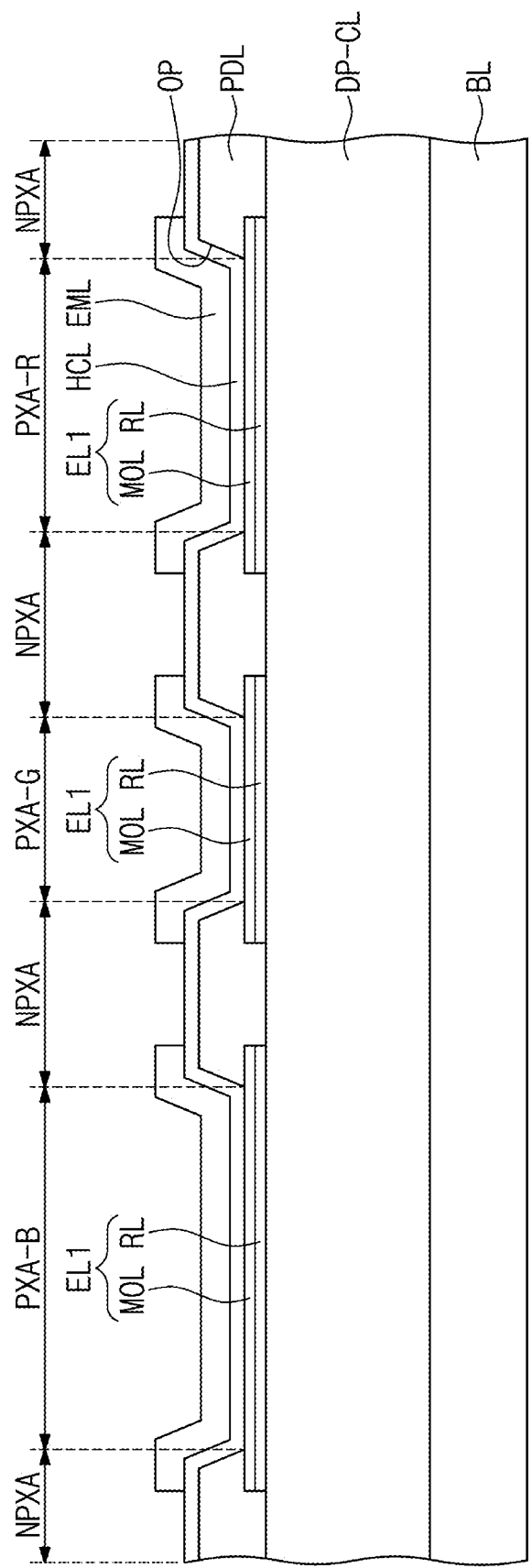
Figure 7F:
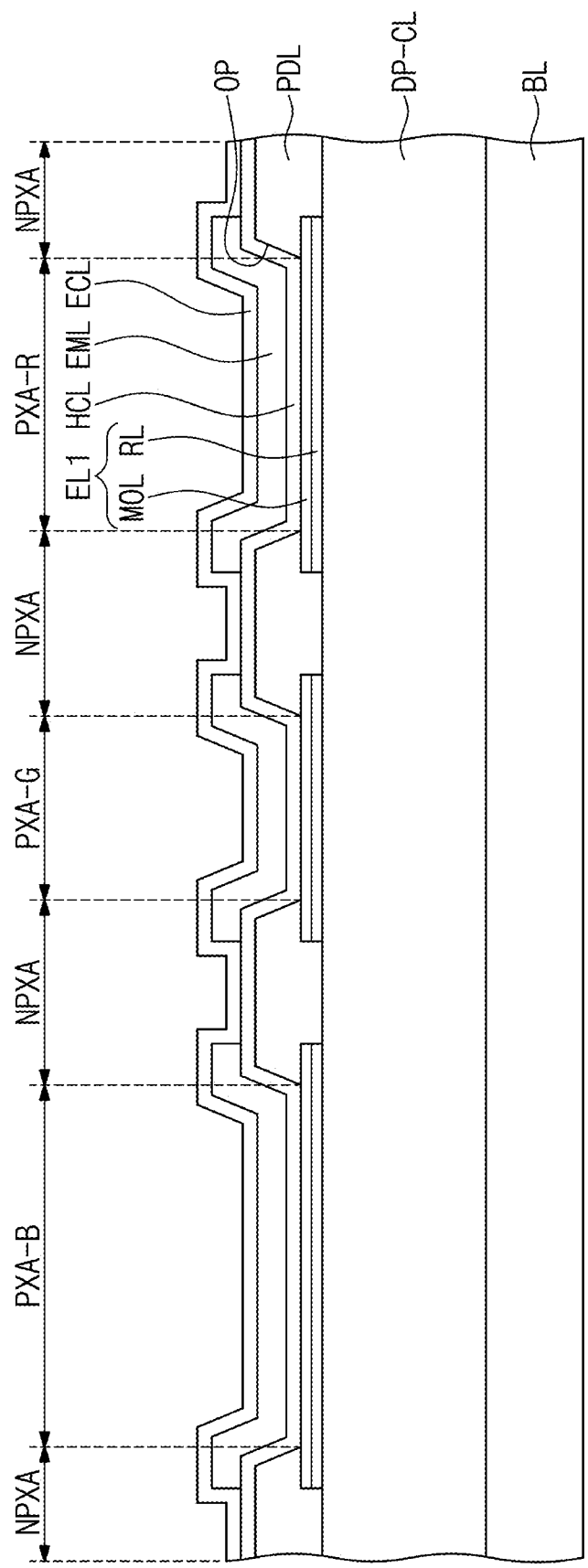

As shown in FIG. 7E, the light-emitting layer EML may be formed on the hole control layer HCL. The light-emitting layers EML may be formed to include a plurality of separate patterns that are provided on the light-emitting regions PXA-R, PXA-G, and PXA-B, respectively. In some embodiments, the separate patterns may be formed by patterning light-emitting layers EML utilizing a mask. When the light-emitting layer EML is utilized to emit white light, the light-emitting layer EML may be formed in common (e.g., as a continuous layer) on the non-light-emitting region NPXA and the light-emitting regions PXA-R, PXA-G, and PXA-B. As shown in FIG. 7F, the electron control layer ECL may be formed on the light-emitting layer EML. The inventive concept is not limited to the afore-described method for forming the functional layers.

Figure 7G:
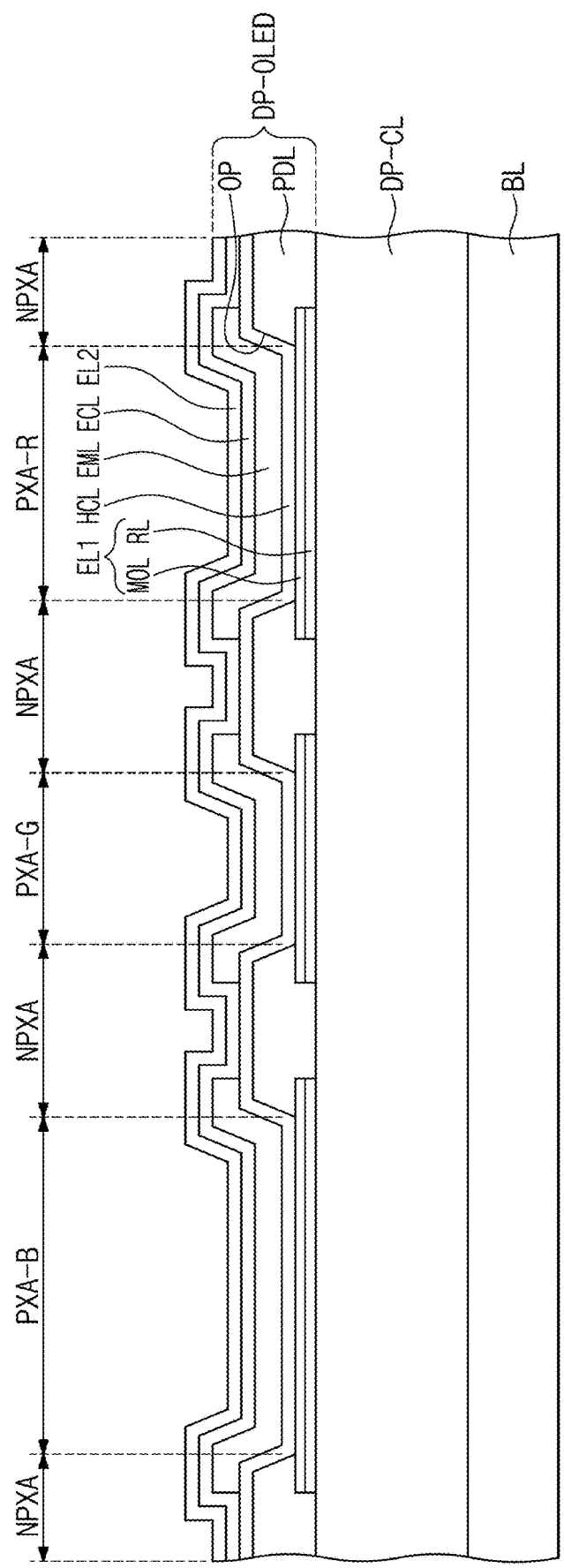

As shown in FIG. 7G, the second electrode EL2 may be formed on the electron control layer ECL. The second electrode EL2 may be formed by a physical vapor deposition method, a chemical vapor deposition method, an atomic layer deposition method, and/or the like, but the inventive concept is not limited thereto.

Figure 7H:
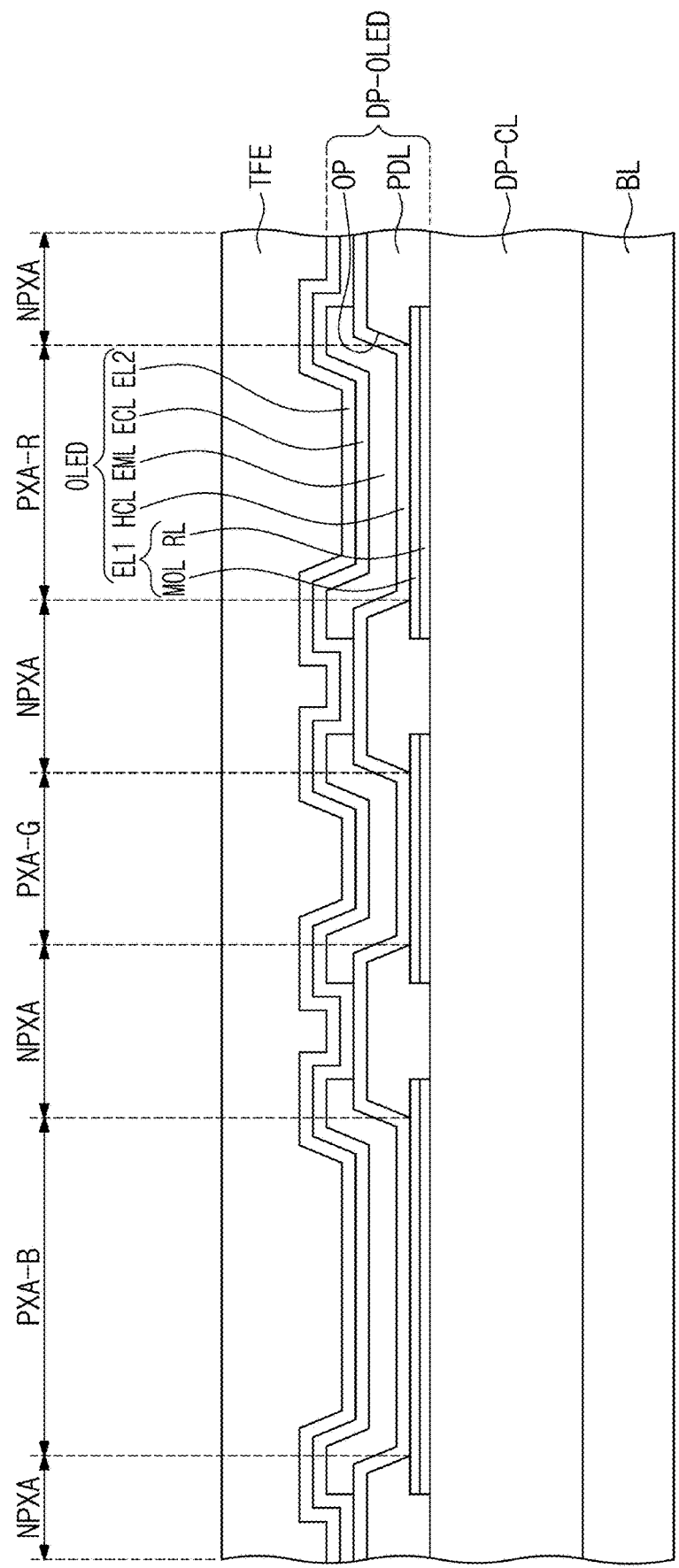

As shown in FIG. 7H, the thin-film encapsulation layer TFE may be formed on the second electrode EL2. The thin-film encapsulation layer TFE may include at least one inorganic layer, which may be formed by a deposition method. The thin-film encapsulation layer TFE may further include an organic layer, which may be formed by a deposition or coating method, and/or the like.

The organic light-emitting diode ED according to an embodiment of the present invention may have the same lamination structure as the organic light-emitting diode ED described with reference to FIGS. 1 and 2. The metal oxide layer MOL according to the present embodiment has a composition different from that of the metal oxide layer MOL of FIGS. 1 and 2. Hereinafter, it will be described focusing on the metal oxide layer (MOL).

In this embodiment, the metal oxide layer MOL may be directly disposed on the reflective layer RL. The metal oxide layer MOL according to the present embodiment satisfies the second, third, and fourth conditions described above.

In consideration of the above conditions, the metal oxide layer MOL may include a mixture of a first metal, a second metal, a first metal oxide and a second metal oxide. In some embodiments, the first metal may be molybdenum, the second metal may be a group-V element. The first metal oxide may be molybdenum oxide, and the second metal oxide may be an oxide of a group-V element. The molybdenum oxide may include molybdenum dioxide ($MoO_2$) whose conductivity is higher than that of molybdenum trioxide ($MoO_3$).

The molybdenum oxide may have a high work-function. For example, the molybdenum oxide may have a work-function of about 5.1 eV. The molybdenum oxide may have a higher work-function than ITO and IZO, each of which has a work-function of about 4.7 eV. However, since the molybdenum oxide has high water solubility, it may be damaged in a subsequent wet process (e.g., for forming an organic layer and the like). Since the metal oxide layer MOL further contains the oxide of the group-V element, it may be possible to decrease the water solubility of the metal oxide layer MOL and to prevent it from being damaged in a subsequent wet process.

Figure 8A:
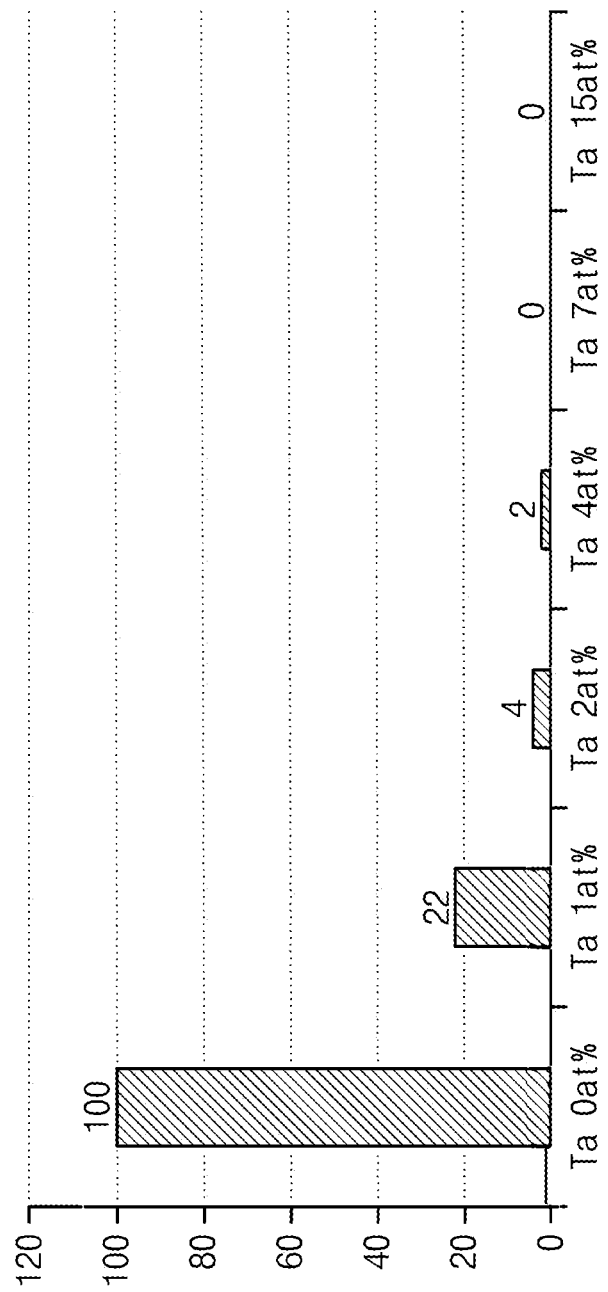
FIG. 8A is a graph showing water solubility of a metal oxide layer, according to the content of tantalum.

FIG. 8A shows a change in water solubility of the metal oxide layer MOL containing a mixture of molybdenum, tantalum, molybdenum oxide and tantalum oxide. The water solubility is a relative comparison based on the metal oxide layer containing no tantalum (with 0 at %). Here, the tantalum oxide was tantalum pentoxide ($Ta_2O_5$). The water solubility of the metal oxide layer MOL containing tantalum and tantalum oxide had values that were lower than 20% (i.e., ⅕ times) the water solubility of a metal oxide layer, in which tantalum and tantalum oxide are not contained.

As shown in FIG. 8A, when the atomic percent of tantalum (Ta) was lower than 2 at %, the water solubility had a greater value. This indicates that to ensure the reliability of the metal oxide layer MOL in a subsequent wet process, it is necessary to maintain an atomic percent of tantalum (Ta) to a total metal oxide layer to 2 at % or higher.

In some embodiments, an atomic percent of tantalum (Ta) to the total metal oxide layer may be lower than 10 at %, and in this case, it may be possible to realize the metal oxide layer MOL with a sufficiently high conductance. If the atomic percent of tantalum (Ta) is higher than 10 at %, the metal oxide layer MOL may have a work-function that is lower than a specific reference (e.g., predetermined or set) value. When the atomic percent of tantalum (Ta) is 2 at %, the metal oxide layer MOL having a thickness of 1000 Å may have a work-function of 5.5 eV, and the higher the atomic percent of tantalum (Ta), the lower the work-function of the metal oxide layer MOL.

Figure 8B:
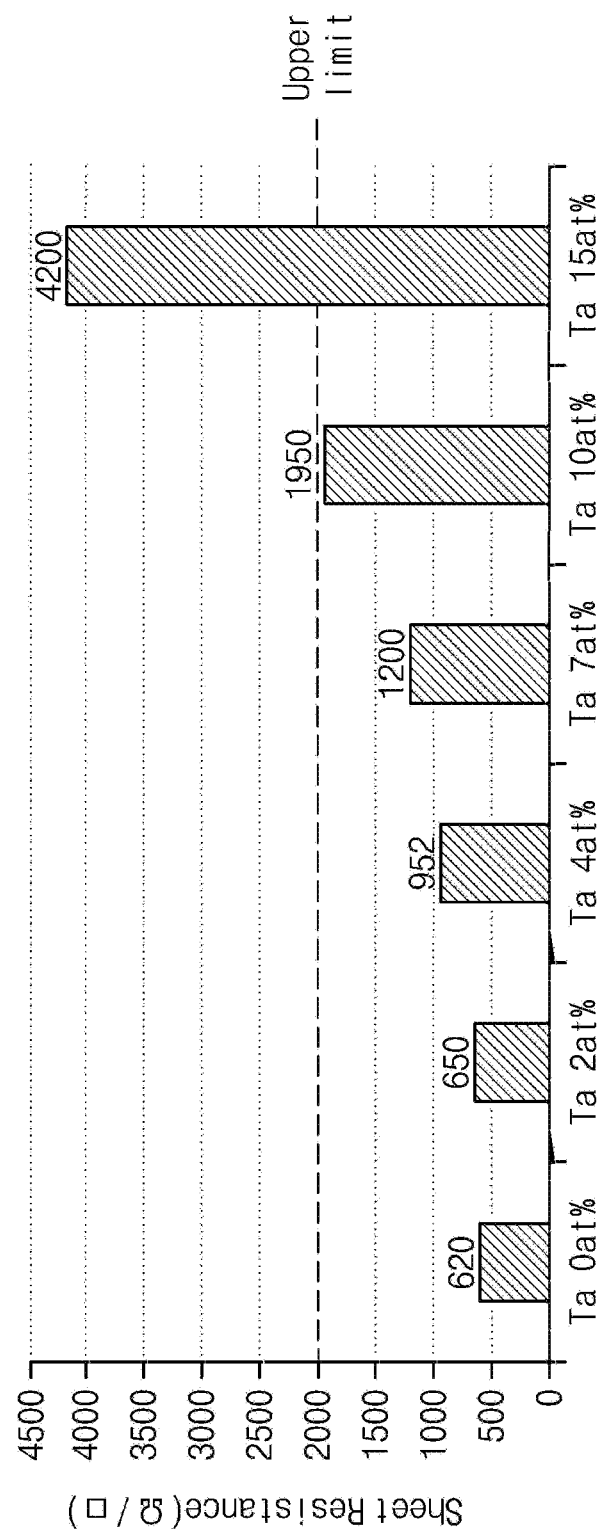
FIG. 8B is a graph showing sheet resistance of a metal oxide layer, according to the content of tantalum.

FIG. 8B shows values of sheet resistance measured from a 2000 Å-thick metal oxide layer having a mixture of molybdenum, tantalum, molybdenum oxide and tantalum oxide. The metal oxide layer had a sheet resistance higher than a reference value (i.e., 2000Ω/□), when the atomic percent of tantalum (Ta) was higher than 10 at %.

An atomic percent of molybdenum (Mo) to the total metal oxide layer may range from 35 at % to 45 at % (for example, from 38 at % to 42 at %). An atomic percent of oxygen (O) to the total metal oxide layer may range from 50 at % to 60 at % (for example, from 53 at % to 57 at %). An atomic percent of a group-V element to the total metal oxide layer may range from 2 at % to 10 at % (for example, from 2 at % to 7 at %). Here, the atomic percent of oxygen is lower than the stoichometric value due to the existence of elemental molybdenum and/or the group-V element, which are not bonded to the oxygen atom in the oxidized state.

Figure 8C:
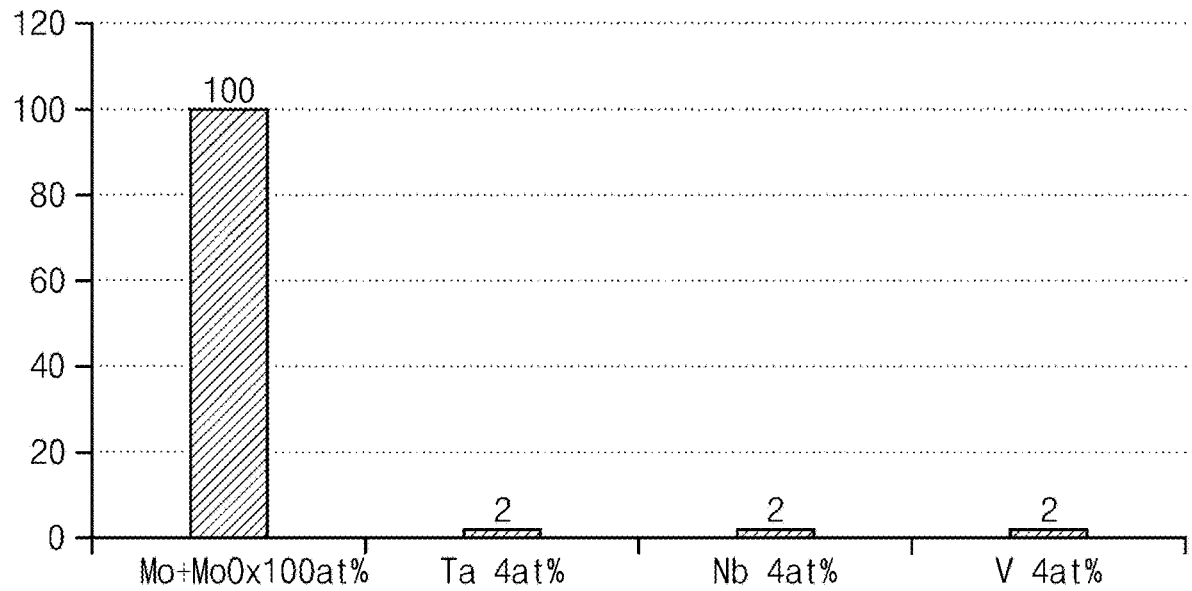
FIG. 8C is a graph showing water solubility of a metal oxide layer containing niobium or vanadium.

In FIG. 8C, water solubility of a metal oxide layer containing a mixture of molybdenum, niobium, molybdenum oxide and niobium oxide, and water solubility of a metal oxide layer containing a mixture of molybdenum, vanadium, molybdenum oxide and vanadium oxide are illustrated in comparison to the water solubility of the metal oxide layer MOL containing a mixture of molybdenum, tantalum, molybdenum oxide and tantalum oxide. The water solubility values of the metal oxide layers were evaluated in the same manner. A reference condition (tantalum 0 at %) in FIG. 8C is the same as that in FIG. 8A. That is, the water solubility is a relative comparison based on the metal oxide layer containing no tantalum (with 0 at %).

The metal oxide layer containing a mixture of molybdenum, niobium, molybdenum oxide and niobium oxide and the metal oxide layer containing a mixture of molybdenum, vanadium, molybdenum oxide and vanadium oxide had water solubility values similar to that of the metal oxide layer MOL containing a mixture of molybdenum, tantalum, molybdenum oxide and tantalum oxide.

Figure 8D:
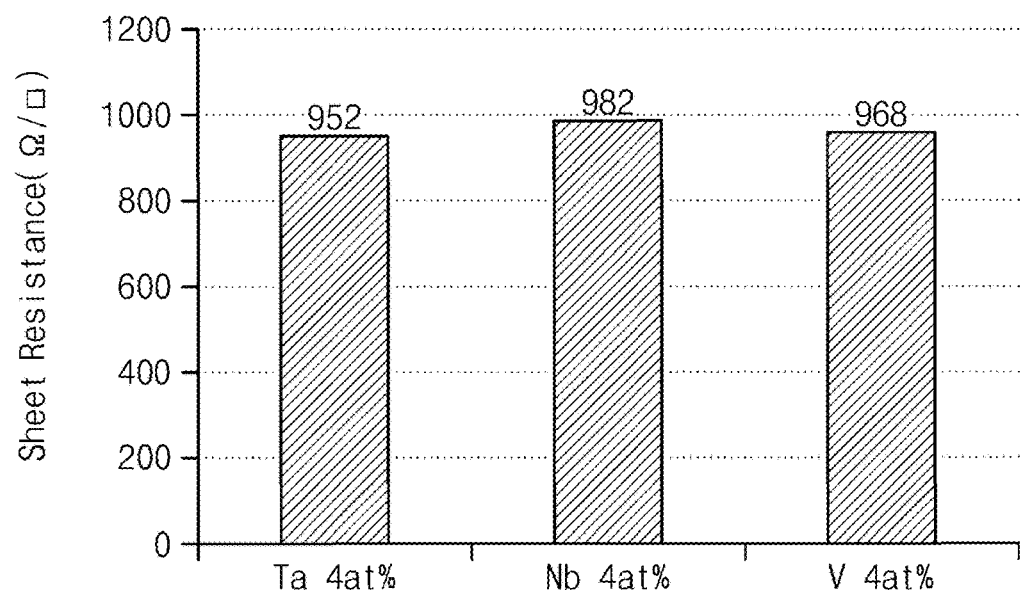
FIG. 8D is a graph showing sheet resistance of a metal oxide layer containing niobium or vanadium.

In FIG. 8D, sheet resistance of a metal oxide layer containing a mixture of molybdenum, niobium, molybdenum oxide and niobium oxide and sheet resistance of a metal oxide layer containing a mixture of molybdenum, vanadium, molybdenum oxide and vanadium oxide are illustrated in comparison to the sheet resistance of the metal oxide layer MOL containing a mixture of molybdenum, tantalum, molybdenum oxide and tantalum oxide. The sheet resistance values of the metal oxide layers were evaluated under the same condition.

The metal oxide layer containing a mixture of molybdenum, niobium, molybdenum oxide and niobium oxide and the metal oxide layer containing a mixture of molybdenum, vanadium, molybdenum oxide and vanadium oxide have sheet resistance values slightly higher than that of the metal oxide layer containing a mixture of molybdenum, tantalum, molybdenum oxide and tantalum oxide, but such a difference is not significant (i.e., there was no meaningful difference).

The metal oxide layer MOL containing a mixture of molybdenum, tantalum, molybdenum oxide and tantalum oxide may be suitable for a dry etching process. As shown in the following Table 4, a molybdenum fluorine (F) compound, a molybdenum chlorine (Cl) compound, a fluorine compound of group-V element, and a chlorine compound of group-V element are volatilized at temperature of 100° C. or lower, and thus, the second condition may be satisfied.

TABLE 4

| Compound | Volatilization Temperature (° C.) |
|---|---|
| Molybdenum Fluorine Compound | −100 |
| Molybdenum Chlorine Compound | 53 |
| Vanadium Fluorine Compound | −100 |
| Vanadium Chlorine Compound | 10 |
| Niobium Fluorine Compound | 66.5 |
| Niobium Chlorine Compound | 14.3 |
| Tantalum Fluorine Compound | −23 |
| Tantalum Chlorine Compound | 14.5 |

Figure 9:
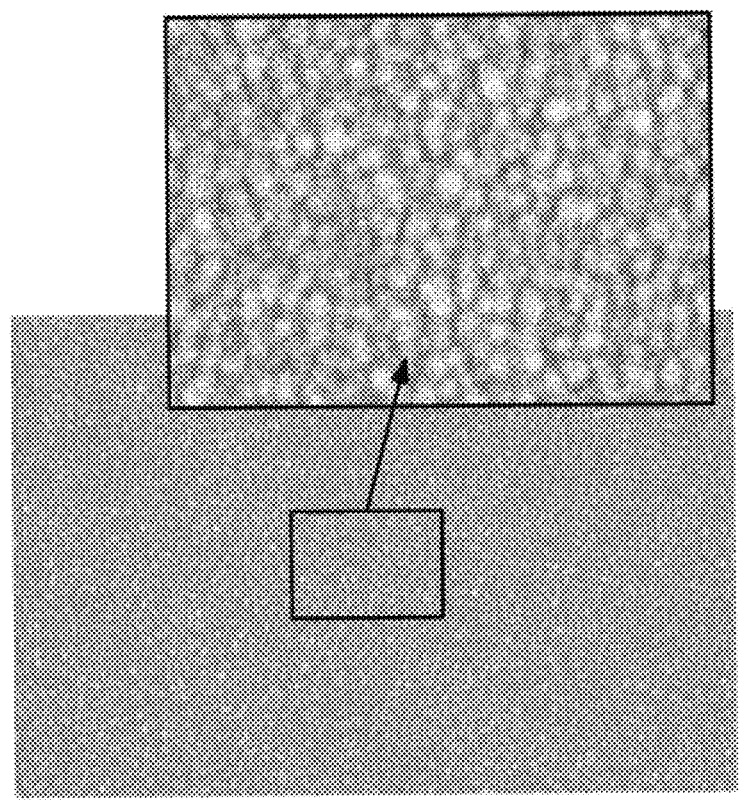
FIG. 9 is a scanning electron microscope (SEM) image of a first electrode according to some embodiments of the inventive concept.

FIG. 9 is a scanning electron microscope (SEM) image of the metal oxide layer MOL containing a mixture of molybdenum, tantalum, molybdenum oxide and tantalum oxide. The metal oxide layer MOL may have an amorphous structure with a good surface flatness (e.g., smoothness). The following Table 5 shows the analysis results of the metal oxide layer MOL.

TABLE 5

| Roughness (AFM analysis) | | Composition Ratio (XPS analysis) | | | Crystalline Structure |
|---|---|---|---|---|---|
| RMS (nm) | RPV (nm) | Mo (at %) | O (at %) | Ta (at %) | (XRD analysis) |
| 0.37 | 4.69 | 40.37 | 55.36 | 4.27 | Amorphous |

In some embodiments, the metal oxide layer MOL may include an element X and oxide of the element X, where the element X contains one of titanium (Ti), tungsten (W), germanium (Ge), tin (Sn), and zirconium (Zr) instead of a group-V element and an oxide of a group-V element. The oxide of titanium (Ti), tungsten (W), germanium (Ge), tin (Sn), or zirconium (Zr) may have an insoluble property (e.g., may be insoluble in water). Since the metal oxide layer MOL contains a mixture of molybdenum, molybdenum oxide, one of titanium (Ti), tungsten (W), germanium (Ge), tin (Sn), and zirconium (Zr) and one of the oxides of titanium (Ti), tungsten (W), germanium (Ge), tin (Sn), and zirconium (Zr), it may have a work-function similar to that of ITO and IZO, and a water solubility lower than that of a mixture of molybdenum and molybdenum oxide. In the metal oxide layer MOL, an atomic percent of titanium (Ti), tungsten (W), germanium (Ge), tin (Sn), or zirconium (Zr) to the total metal oxide may range from 2 at % to 10 at %.

In addition, a fluorine compound of titanium (Ti), tungsten (W), germanium (Ge), or tin (Sn), and a chlorine compound of titanium (Ti), tungsten (W), germanium (Ge), tin (Sn), or zirconium (Zr) may have a volatilization temperature of 100° C. or lower, as shown in Table 6. Thus, the metal oxide layer MOL, in which molybdenum oxide and the oxide of one of titanium (Ti), tungsten (W), germanium (Ge), tin (Sn), and zirconium (Zr), may be suitable for a dry etching process.

TABLE 6

| Compound | Volatilization Temperature (° C.) |
|---|---|
| Titanium Fluorine Compound | 45 |
| Titanium Chlorine Compound | −95 |
| Tungsten Fluorine Compound | −100 |
| Tungsten Chlorine Compound | 66.2 |
| Germanium Fluorine Compound | −100 |
| Germanium Chlorine Compound | −100 |
| Tin Fluorine Compound | −100 |
| Tin Chlorine Compound | −100 |
| Selenium Fluorine Compound | −100 |
| Selenium Chlorine Compound | −100 |
| Zirconium Chlorine Compound | 70 |

The metal oxide layer MOL may have a thickness ranging from about 30 Å to about 100 Å. If the thickness of the metal oxide layer MOL is less than 30 Å, due to inherent characteristics of a sputtering process, it may be difficult to realize uniformity in thickness of the metal oxide layer MOL, and if the thickness of the metal oxide layer MOL is larger than 100 Å, an amount of light, which is reflected by the reflection layer RL and is absorbed by the metal oxide layer MOL, may be greater than a reference (e.g., predetermined or set) amount.

The method of manufacturing the display panel according to the present embodiment is substantially the same as the method of manufacturing the display panel DP described with reference to FIGS. 7A to 7H. Here, only the differences between the above manufacturing methods will be briefly described.

As shown in FIG. 7A, the metal oxide layer MOL may be formed on the reflection layer RL. As described above, the metal oxide layer MOL may include a mixture of a first metal, a second metal, a first metal oxide, and a second metal oxide. In the present embodiment, the metal oxide layer MOL may be formed utilizing a sputtering method The target material may include a mixture of a first metal oxide and a second metal oxide. In this embodiment, the target material may include a mixture of molybdenum oxide and tantalum oxide. Molybdenum oxide may include $MoO_2$, $MoO_3$, $Mo_4O_{11}$. Tantalum oxide may include $Ta_2O_5$. The area ratio (e.g., volume ratio) of $MoO_2$, $MoO_3$, $Mo_4O_{11}$, and $Ta_2O_5$ to the entire target material may be 21.2%, 17.5%, 59.3%, and 2.0%, respectively.

In the process of sputtering, oxygen may be consumed by the vacuum pump (discharged from the chamber) and the deposited metal oxide layer may have an oxygen content lower than that of the target composition. Ar+(argon iron) transfers momentum to the target surface and physically tears it away from the target in atomic form. The separated atoms are then deposited on the substrate (on the reflective layer). In the case of MoTaOx, it is separated from the target in the form of atoms, molecules, and/or ions of Mo, Ta, O, $O_2$ and deposited on the substrate through a vacuum space. The substrate is deposited in the form of MoOx, TaOx, Mo, and Ta. Mo and O react in a vacuum space or after deposition. Ta and O react similarly to a reaction between Mo and O. Some of Mo and Ta may exist in the metal oxide layer in the form of atoms (e.g., not bond to an oxygen atom, in elemental form and not oxidized).

The subsequent processes are substantially the same as those described with reference to FIGS. 7B to 7H.

According to the afore-described embodiments of the inventive concept, a first electrode may be formed of or include aluminum, and this may allow the first electrode to have uniform and high reflectance throughout the entire wavelength range of visible light. The first electrode may be further formed of or include molybdenum oxide, and this may allow the first electrode to have a large work-function. The first electrode may be patterned by a dry etching process. Accordingly, the first electrode may be formed to have a small pitch, compared to when it is formed by a wet etching process. The first electrode may further include an oxide of a group-V element (e.g., tantalum oxide), thereby having low water solubility. Therefore, it may be possible to prevent or substantially prevent the first electrode from being damaged by a subsequent wet process.

While some embodiments of the inventive concepts have been particularly shown and described, it will be understood by one of ordinary skill in the art that variations in form and detail may be made therein without departing from the spirit and scope of the attached claims, and equivalents thereof.

What is claimed is:

1. A light-emitting device, comprising:
a first electrode comprising a reflection layer and a metal oxide layer on the reflection layer;
a second electrode spaced apart from the first electrode; and
a light-emitting layer between the first electrode and the second electrode,
wherein the metal oxide layer is between the reflection layer and the light-emitting layer,
the metal oxide layer comprises molybdenum, a group-V element, and oxygen, and
a content of the group-V element to a total amount of the metal oxide layer ranges from 2 at % to 10 at %, and
a content of molybdenum to the total amount of the metal oxide layer ranges from 35 at % to 45 at %, and a portion of molybdenum is in elemental form not bond to oxygen atoms in an oxidized state.

2. The device of claim 1, wherein the group-V element is tantalum, the metal oxide layer comprises tantalum pentoxide, and a content of tantalum to the total amount of the metal oxide layer ranges from 2 at % to 7 at %.

3. The device of claim 1, wherein a content of oxygen to the total amount of the metal oxide layer ranges from 50 at % to 60 at %.

4. The device of claim 1, wherein the metal oxide layer has a thickness ranging from about 30 Å to about 100 Å.

5. The device of claim 1, wherein the reflection layer comprises aluminum (Al).

6. The device of claim 1, wherein the reflection layer comprises an aluminum-nickel alloy.

7. The device of claim 1, wherein the reflection layer comprises an aluminum-nickel-lanthanum alloy.

8. The device of claim 7, wherein a content of nickel to a total amount of the reflection layer ranges from 0.01 at % to 2.0 at %, and a content of lanthanum to the total amount of the reflection layer ranges from 0.01 at % to 1.0 at %.

9. The device of claim 1, wherein the reflection layer has a thickness ranging from about 700 Å to about 1500 Å.

10. The device of claim 1, wherein the metal oxide layer is directly on the reflection layer.

11. The device of claim 1, further comprising an anti-oxidation layer between the reflection layer and the metal oxide layer,
wherein the anti-oxidation layer comprises at least one element selected from the group consisting of nickel and titanium.

12. The device of claim 11, wherein the anti-oxidation layer has a thickness ranging from about 10 Å to about 100 Å.

13. A light-emitting device, comprising:

a first electrode comprising a reflection layer and a metal oxide layer on the reflection layer;

a second electrode spaced apart from the first electrode; and a light-emitting layer between the first electrode and the second electrode, wherein the metal oxide layer is between the reflection layer and the light-emitting layer and comprises a first metal in elemental form not bond to oxygen atoms in an oxidized state, a second metal in elemental form not bond to oxygen atoms in an oxidized state, a first metal oxide and a second metal oxide, the first metal comprises molybdenum, the first metal oxide comprises molybdenum, the second metal comprises at least one metal selected from the group consisting of vanadium (V), niobium (Nb), tantalum (Ta), titanium (Ti), tungsten (W), germanium (Ge), tin (Sn), and zirconium (Zr), the second metal oxide comprises the at least one metal selected from the group consisting of vanadium (V), niobium (Nb), tantalum (Ta), titanium (Ti), tungsten (W), germanium (Ge), tin (Sn), and zirconium (Zr), a content of the at least one metal selected from the group consisting of vanadium (V), niobium (Nb), tantalum (Ta), titanium (Ti), tungsten (W), germanium (Ge), tin (Sn), and zirconium (Zr) to a total amount of the metal oxide layer ranges from 2 at % to 10 at %, and a content of molybdenum to the total amount of the metal oxide layer ranges from 35 at % to 45 at %.

14. The device of claim 13, wherein a content of oxygen to the total amount of the metal oxide layer ranges from 50 at % to 60 at %.

* * * * *